United States Patent [19]

Maltby et al.

[11] Patent Number: 4,573,040

[45] Date of Patent: Feb. 25, 1986

[54] FAIL-SAFE INSTRUMENT SYSTEM

[75] Inventors: Frederick L. Maltby, Jenkintown; L. Jonathan Kramer, Warminster, both of Pa.

[73] Assignee: Drexelbrook Engineering Company, Horsham, Pa.

[21] Appl. No.: 700,672

[22] Filed: Feb. 11, 1985

Related U.S. Application Data

[63] Continuation of Ser. No. 419,127, Sep. 17, 1982, abandoned.

[51] Int. Cl.[4] .................. G08B 29/00; G01R 11/52

[52] U.S. Cl. .................. 340/511; 340/507; 340/508; 340/612; 324/57 R; 324/60 R

[58] Field of Search .................. 340/511, 500, 531, 533, 340/537, 538, 506–510, 612, 657, 660–664; 324/57 R, 58.5 A, 60 R, 60 C, 61 R, 61 P, 65 R, 65 CR, 65 P

[56] References Cited

U.S. PATENT DOCUMENTS

| | | | |
|---|---|---|---|
| 3,757,323 | 9/1973 | Pintell | 340/533 |
| 3,786,501 | 1/1974 | Marnerakis | 340/511 |
| 3,927,404 | 12/1975 | Cooper | 340/533 |
| 4,007,456 | 2/1977 | Paige et al. | 340/507 |
| 4,020,488 | 4/1977 | Martin et al. | 340/508 |
| 4,103,299 | 7/1978 | Swinehart | 340/506 |
| 4,194,195 | 3/1980 | Merrell et al. | 340/507 |
| 4,203,095 | 5/1980 | Wilson, Jr. | 340/506 |
| 4,363,030 | 12/1982 | Maltby et al. | 340/511 |

FOREIGN PATENT DOCUMENTS

| | | | |
|---|---|---|---|
| 2063581 | 12/1978 | Fed. Rep. of Germany | 340/511 |
| 2755826 | 6/1979 | Fed. Rep. of Germany | 340/511 |
| 1401146 | 7/1975 | United Kingdom . | |

*Primary Examiner*—Donnie L. Crosland
*Attorney, Agent, or Firm*—Woodcock Washburn Kurtz Mackiewicz & Norris

[57] ABSTRACT

In an instrument system consisting of a transmitter in one location and a receiver in another location connected by a transmission medium, fail-safe operation is obtained by restricting the output of the transmitter to well-defined levels and interpreting any substantial departure of the received signal from these well-defined levels as a failure. When a failure is detected, alarms or other equipment may be activated, including a control circuit which causes replacement of the defective transmitter or transmission medium, thereby restoring the system to service. An embodiment wherein the transmitter is an admittance-responsive transmitter in a two-wire current loop for monitoring the condition of materials is described.

12 Claims, 17 Drawing Figures

10(D)

FAIL-SAFE INSTRUMENT SYSTEM

This is a continuation of application Ser. No. 419,127, filed Sept. 17, 1982, abandoned.

BACKGROUND OF THE INVENTION

Reliability is a prime concern in condition-indicating or control instrumentation. Since instrument systems that are immune to failure do not exist, it is desirable for instrument systems to fail in a manner which causes the least troublesome indication or control action. Instruments are commonly specified as having a fail-safe state which is that state assumed by an instrument's output upon loss of power to the instrument. Desirably this state is the one which causes the least trouble indication or control action. This type of system will fail safely for those failures which have the same effect on the output as does loss of power.

In the control of industrial processes it may be desirable to use information about a process at a remote location. An example of such a situation is centralized monitoring or control. Information must then be transmitted from the process via a transmission medium to a remote receiver where the information is displayed or acted upon. The transmission medium itself is subject to failure, though, and may not generally be assumed to fail in a manner which causes the least-damaging response at the receiver. Thus, transmission of a signal may nullify the fail-safe capability of the signal transmitter. Consider, for instance, an on-off instrument whose output is the making or breaking of a set of contacts wherein the contacts are open upon loss of power. The output is to be transmitted to a remote receiver by a pair of wires, one connected to each contact. The signal present at the receiver is either a very high impedance or a very low impedance. The received signal may be due to normal operation of the contacts in the transmitter or to open or shorted signal transmission wires, so the receiver in such a system cannot distinguish failures from normal operation. It is small comfort that some failures will fortuitously give the least-damaging result.

Various techniques exist for detection of failures in the generation and transmission of signals, alerting users to such failures, and taking the least-damaging action. For instance, redundant systems may be used and differences between redundant outputs interpreted as evidence of a failure. If a sufficient number of redundant systems is used, the proper output may be assumed to be the majority output. Another approach is to apply checking signals at various points in the signal path and verifying at the receiver that the appropriate effect is present. See, e.g., U.S. Pat. No. 3,202,796 to Rowell. Such checking signals may be substitutions for or modulations of the signal which is the result of a measurement, and may be applied periodically by a timing mechanism or in response to reception of the effects of such a checking signal. Both approaches gain their ability to detect failures at the expense of increased cost and complexity. In the case of redundant systems, two systems are required to detect a failure and three systems are required to determine the proper output in the event of failure in one system. This approach thus entails considerable expense. The checking signal approach requires the provision of supervisory apparatus, checking signal generators, and additional transmission media for either the checking signals themselves or control signals, all at extra expense. Moreover, the checking signal mechanisms themselves increase the probability of system failure, and a process shut down due to checking mechanism failure, albeit one which causes the least-damaging result, may be less desirable than a functioning process with instruments whose failures will not be detected. Another shortcoming, common to both approaches discussed above, is their requirement of signal transmission media. In large manufacturing facilities the distance between a transmitter and a receiver may be on the order of a mile. The cost of such a long transmission channel may be the dominant expense in an instrument system, so the cost of additional channels for redundant systems or checking signals may have a great impact on system cost. Also, there may be requirements of intrinsic safety for transmitter and transmission media, and the cost of protecting additional transmitter or transmission channels against intrusion of hazardous energy levels may be large.

The transmission of electrical signals over long distances poses threats to system reliability by increasing exposure to deleterious environmental effects such as radio-frequency interference (RFI) and high energy transients. A practical embodiment of a fail-safe system for transmission of electrical signals should therefore be immune to such hazards.

Another consideration in a system for transmission of signals is that a fault in one system component should not cause damage to other system components. If this is not the case, then consequential failures may prolong the down time of a system which fails.

The present invention provides a fail-safe instrument system without the drawbacks of prior art systems. It should be noted, however, that the prior art techniques may be applied to a system in accordance with this invention, and that the benefits obtained by such application may be greater than those obtained by use of prior art techniques by themselves. For instance, a system is disclosed with two redundant instruments which may be used with a single transmission channel, and in which failure of one instrument still allows determination of the proper output.

OBJECTS OF THE INVENTION

It is therefore a general object of this invention to provide a signal transmission system in which failures cause the least-damaging response.

It is another object to provide a signal transmission system which can detect the occurrence of failures.

It is a further object to provide such a system which requires only one transmission channel between the transmitter and the receiver.

It is also an object to provide such a system wherein failure of the transmission medium does not cause damage to other system components.

It is still a further object to provide a system as above in which the only signal in the transmission channel is that produced by the transmitter in response to its input data.

It is yet a further object to provide a system as above in which the mechanism for failure detection does not significantly increase the probability of system failure.

It is a more specific object to provide a system for monitoring or controlling the condition of materials at a remote location which is in accordance with the above objects.

It is also an object to provide such a system in which the transmitter and the transmission channel may be made intrinsically safe.

It is also an object to provide a system in accordance with the previous objects in which the transmitter is a two wire current loop device, receiving its operating power from the current loop which contains its output signal.

It is another object to provide such a system for monitoring or controlling the condition of materials at a remote location utilizing radio frequency admittance-measuring techniques.

It is a further object to provide such an admittance measuring system capable of measuring materials having a wide variety of characteristics, including materials which tend to form coatings on objects which they contact.

It is a further object to provide such an admittance measuring system in which the transmitter may be mounted remote from the material being measured.

It is a further object to provide such a system for monitoring the condition of materials in which variations in the "ground" or reference point of the sensing element, transmitter, and receiver do not adversely affect the performance of the system.

It is a further object to provide such a system for monitoring the condition of materials which is immune to RFI and high energy transients.

It is a further object to provide systems in accordance with the previous objects in which redundant transmitters may be used and selected over single or redundant transmission channels.

BRIEF DESCRIPTION OF THE DRAWINGS

The invention will be better understood if reference is made to the drawings, in which.

DESCRIPTION OF THE PREFERRED EMBODIMENT

Figure 1:
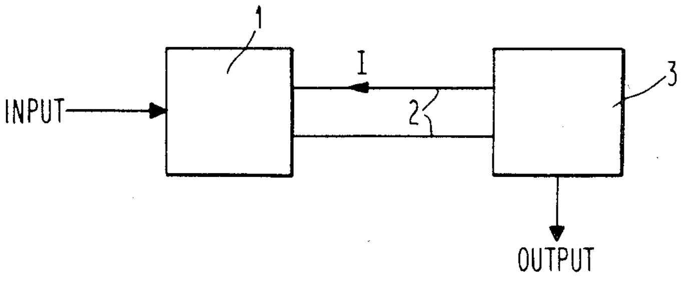
FIG. 1 is a block diagram of a signal transmission system according to the invention.
Figure 2:
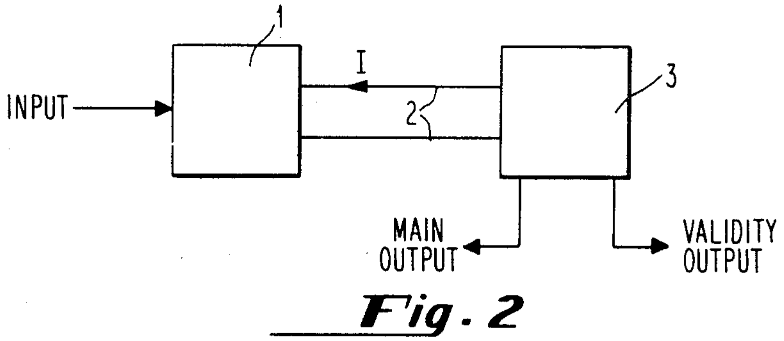
FIG. 2 is a block diagram of a system in accordance with the general objects of the invention.

FIGS. 1 and 2 show block diagrams of systems in accordance with some of the objects of this invention. In both, the system consists of a transmitter 1, a pair of signal wires 2, and a receiver 3. The transmitter 1 has an input which is generally some physical variable whose value is to be measured. The output of the transmitter 1 is a current I in the signal wires 2. This current I flows through the receiver 3 which provides one output in FIG. 1, a main output, and two outputs, in FIG. 2, a main output which in normal operation is a function of the input to the transmitter 1, and a validity output which indicates the occurrence of any of the faults which may befall the system.

Figure 4:
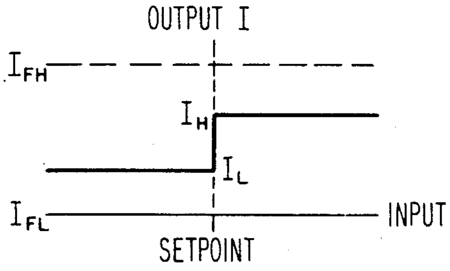
FIG. 4 shows the transfer function of a transmitter according to this invention.
Figure 5:
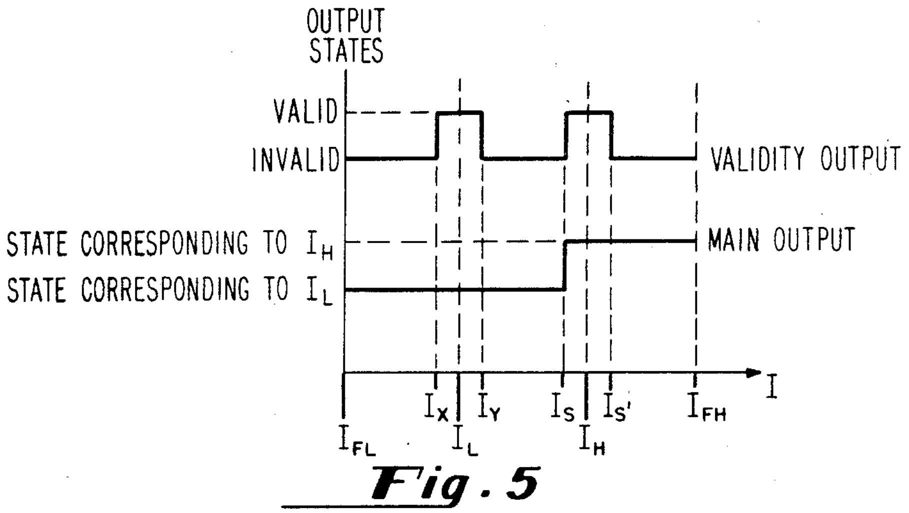
FIG. 5 shows the transfer function of a receiver according to this invention.
Figure 6:
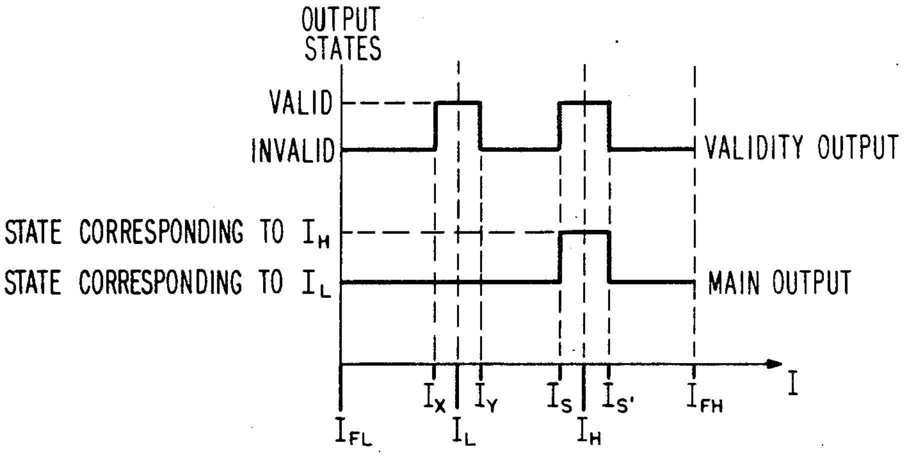
FIG. 6 shows the transfer function of an improved receiver according to this invention.

Operation of the system may be better understood by examining FIGS. 4, 5, and 6 which show transfer functions of the transmitter and receiver. FIG. 4 shows the output I of the transmitter as a function of the transmitter's input. The transmitter controls the current I so that in normal operation I will be one of two possible values, a low current $I_L$ or a high current $I_H$, depending on the value of the input. The transmitter as shown, being a bistable device, has a setpoint such that the output I has one of the possible values when the input is below the setpoint and the other possible value when the input is above the setpoint. Although not shown in FIG. 4, it will be understood that the transmitter may incorporate hysteresis. One important feature of the transmitter of this invention is that its possible outputs $I_L$ and $I_H$ be well separated so that the loop current I may be unambiguously determined by the receiver. Another important feature of the transmitter of this invention is that its possible outputs are well separated from the most common failure states of the signal transmission medium. With a current signal I in a pair of wires, the most-common failure states are a low-current failure state $I_{FL}$ where the signal wires are open-circuited, and a high-current failure state $I_{FH}$ at the maximum failure current possible in the signal loop.

A transmitter may also be constructed in which only one of the possible outputs ($I_L$ or $I_H$) is well defined, the other output being permitted to take any value separated from the well-defined output by some minimum amount of current, ΔI. Such a transmitter may be useful, for example, when the input to the transmitter can only cross the transmitter setpoint in the event or a process failure. One such application is an "excessively high level" backup system on a level which will be controlled by a separate control loop in normal operation.

FIG. 5 shows the states of the main output and the validity output of a receiver in accordance with this invention as functions of the signal current I. These outputs are bistable, and, in a condition-indicating or control system, may desirably be contact closures or logic levels. The main output assumes the state corresponding to $I_H$ at all values of I above a switching point $I_s$ which is less than $I_H$ but greater than $I_L$. The main output assumes the state corresponding to $I_L$ at all values of I below the switching point $I_s$. The main output of the receiver thus corresponds to the transfer function of the transmitter. The validity output assumes a state indicating a valid main output over two separate ranges or "windows" of signal current I, one range containing the low signal current $I_L$ and the other containing the high signal current $I_H$. The validity output assumes a state indicating a system malfunction in three ranges of signal current I, a first range between $I_{FL}$ and $I_L$, a second range between $I_L$ and $I_H$, and a third range between $I_H$ and $I_{FH}$. The invalidity output may also comprise an alarm to alert the operator that there is a system malfunction, and may also be adapted to cause replacement of system components with replacement components; if this replacement does not cause an output FLM, LJK indicative of validity, the alarm may then be sounded. Means for replacement of components are known; see, e.g., Wold, U.S. Pat. No. 1,462,057. Incorrect outputs are avoided by having the switching point $I_s$ correspond to a transition of both outputs.

FIG. 6 shows the states of the main output and the validity output as functions of signal current I in an improved receiver. The improvement over the receiver of FIG. 5 consists of forcing the main output to assume the state corresponding to $I_L$ for all inputs other than in the valid range or window about $I_H$. This arrangement has particular virtue in the control of industrial processes, where the state corresponding to $I_L$ would be the fail-safe state of the system (that is, the state which causes the least-damaging control action to be taken). It will be understood that the choice of state for the fail-safe state is arbitrary—that is, one can alternatively make the fail-safe state correspond to $I_H$, and force the main output to assume this state for all inputs I except in the valid range about $I_L$. Incorrect outputs are avoided by having the switching points $I_s$ and $I_s'$ correspond to transitions of both outputs.

A receiver may also be constructed which has only one output (which may, for example, have the same transfer function as the "main" output shown in FIG. 5 or, preferably, FIG. 6). Such a receiver is especially useful in the same situations in which a transmitter having only one of the possible outputs well-defined would be used.

Figure 7:
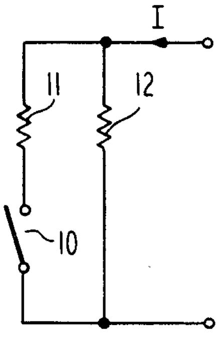
FIG. 7 is a schematic of a first transmitter according to this invention.

FIG. 7 shows a schematic diagram of a transmitter which, in accordance with this invention, has a transfer function as in FIG. 4. This transmitter might be used in conjunction with a voltage source, receiver, and signal wires connected in series to its signal terminals. An input is applied to switch 10 causing it to be open or closed. When switch 10 is open, the current will be equal to the source voltage divided by the resistance of resistor 12$=I_L$. When switch 10 is closed, the current will increase, due to the additional current provided by resistor 11, to $I_H$.

Figure 8:
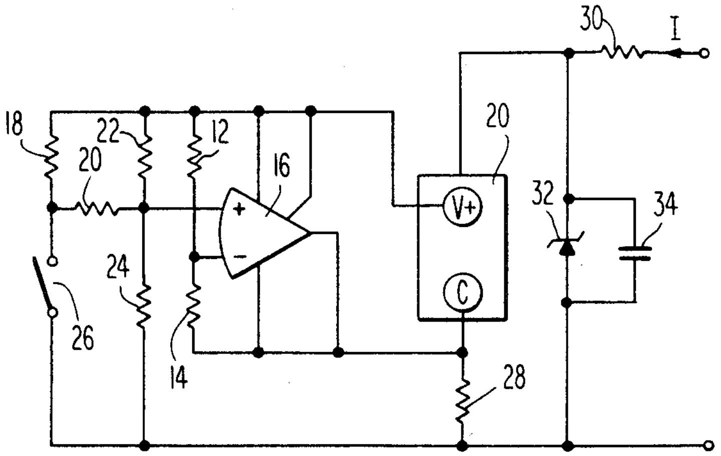
FIG. 8 is a schematic of an improved transmitter according to the invention.

FIG. 8 is a schematic of an improved transmitter in accordance with this invention, the improvement being that the current I is independent of the source voltage driving the loop and the resistance of the loop. In this circuit a voltage regulator 20 provides a stable power supply for the circuitry. A resistive voltage divider comprised of resistors 12 and 14 applies a fraction of the supply voltage to the negative input of the operational transconductance amplifier (O.T.A.) 16. Resistors 18, 20, 22, 24 and switch 26 form a voltage divider feedback network wherein the divider ratio is controlled by the position of the switch 26. This feedback network applies to the positive input of the O.T.A. 16 a fraction of the regulated voltage plus the voltage across resistor 28. The voltage across resistor 28 may be made substantially proportional to the total current I drawn from the signal loop by minimizing the current through resistor 24 and switch 26. The O.T.A. 16 controls the current through resistor 28 so as to have its inputs at the same voltage. An input network comprising resistor 30, diode 32 and capacitor 34 protects the circuit against transients and filters RFI. Thus, employing the terminology of FIG. 4, when switch 26 is closed the current I is controlled at some lower value $I_L$ and when switch 26 is open the current I is controlled at some higher value $I_H$.

Figure 3:
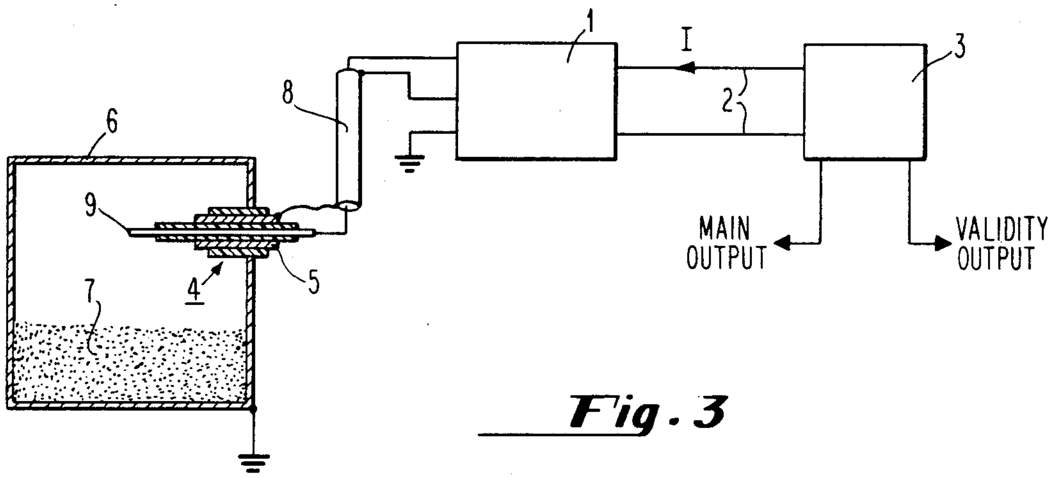
FIG. 3 is a block diagram of an RF admittance-measuring system utilizing the general principles of the invention.

FIG. 3 shows a particular embodiment of the system of FIG. 2 wherein the transmitter controls loop current I in response to an input admittance. The input admittance is provided by an admittance-responsive probe 4, desirably of the guarded type described in U.S. Pat. No. 3,879,644. When installed in a vessel 6 containing a material 7 to be measured, the admittance between the central conductor 9 of the probe 4 and ground (usually the vessel walls) is representative of the condition (e.g. height) of materials 7 in the vessel 6. This admittance is applied to the input of the transmitter 1, which may be mounted at a distance from the vessel 6, by a coaxial cable 8. The center wire of this coaxial cable 8 is connected at one end to the central conductor 9 of the probe 4 and at the other end to the admittance-responsive input of the transmitter 1. The shield of the coaxial cable 8 is connected at one end to a guard shield electrode 5 in the probe 4 and at the other end to a guard terminal in the transmitter 1 which maintains the shield of the coaxial cable 8 at substantially the same potential as its center wire. This guarding technique prevents the detection of stray admittances, for example, coatings, and enables the transmitter 1 to, in normal operation, respond only to the condition of the materials 7 being measured.

Figure 9:
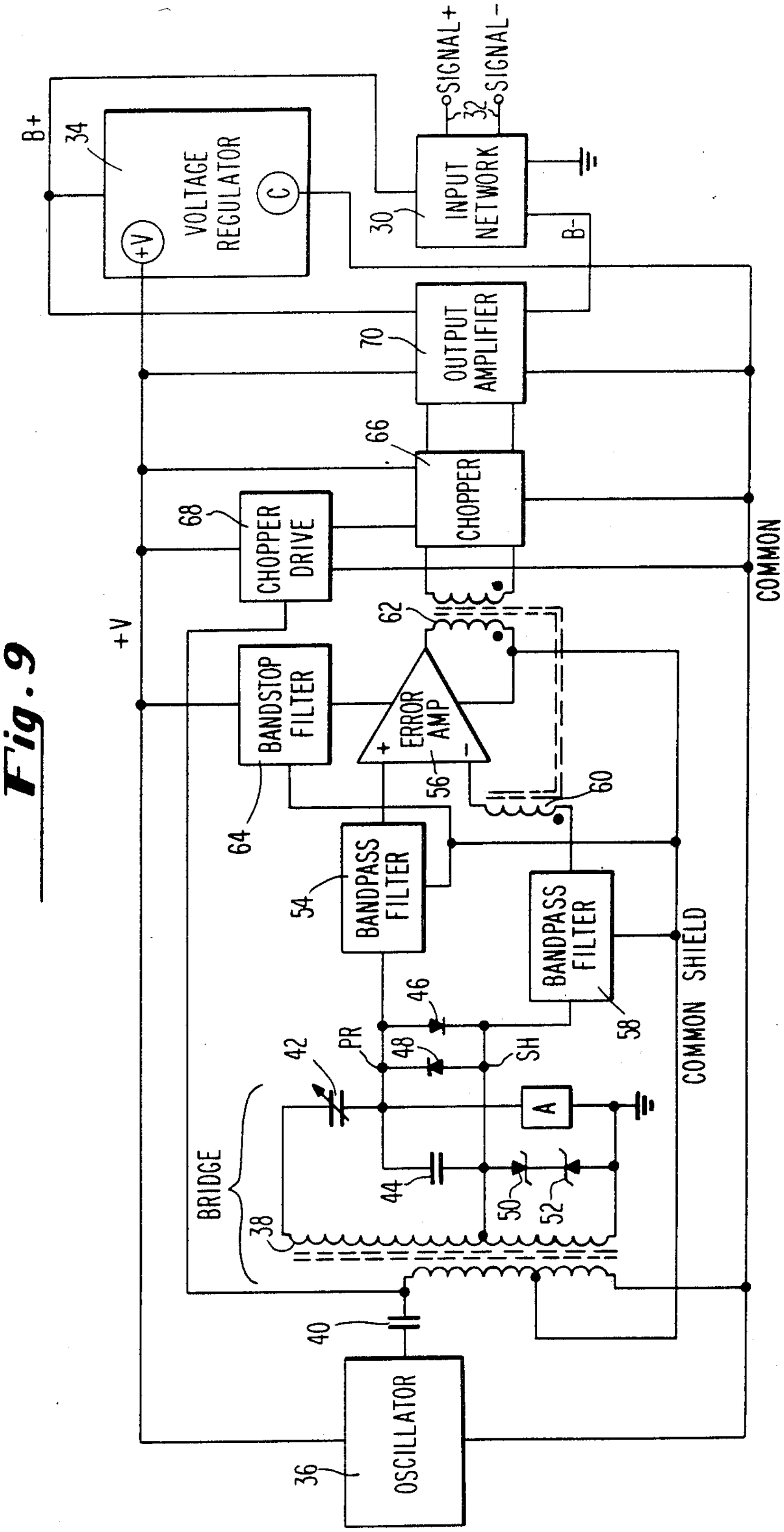
FIG. 9 is a block diagram of a transmitter for RF admittance measurement utilizing the principles of this invention.
Figure 10A:
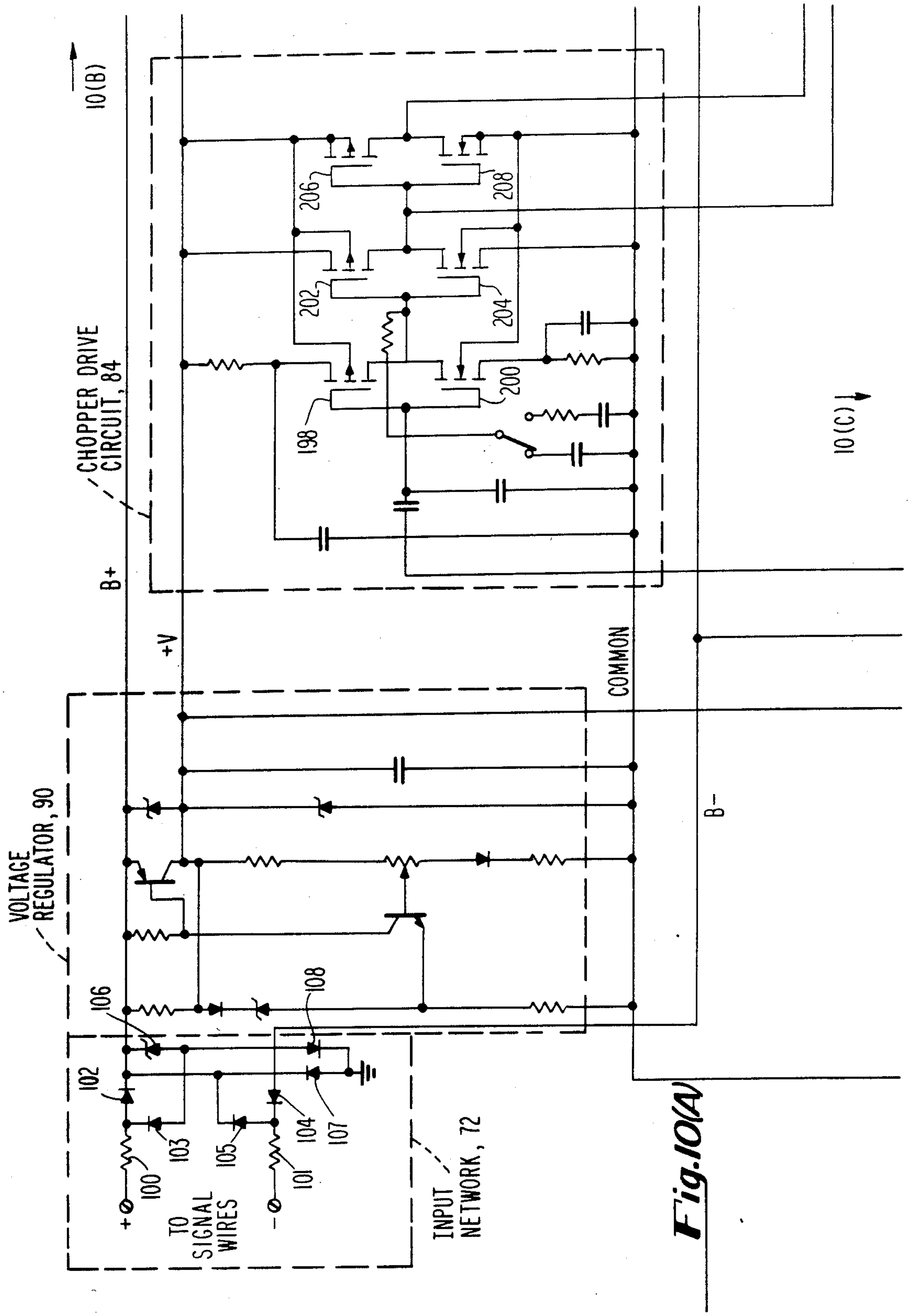
FIG. 10 (comprising FIGS. 10(A)–(D)) is a schematic diagram detailing the block diagram of FIG. 9.
Figure 10B:
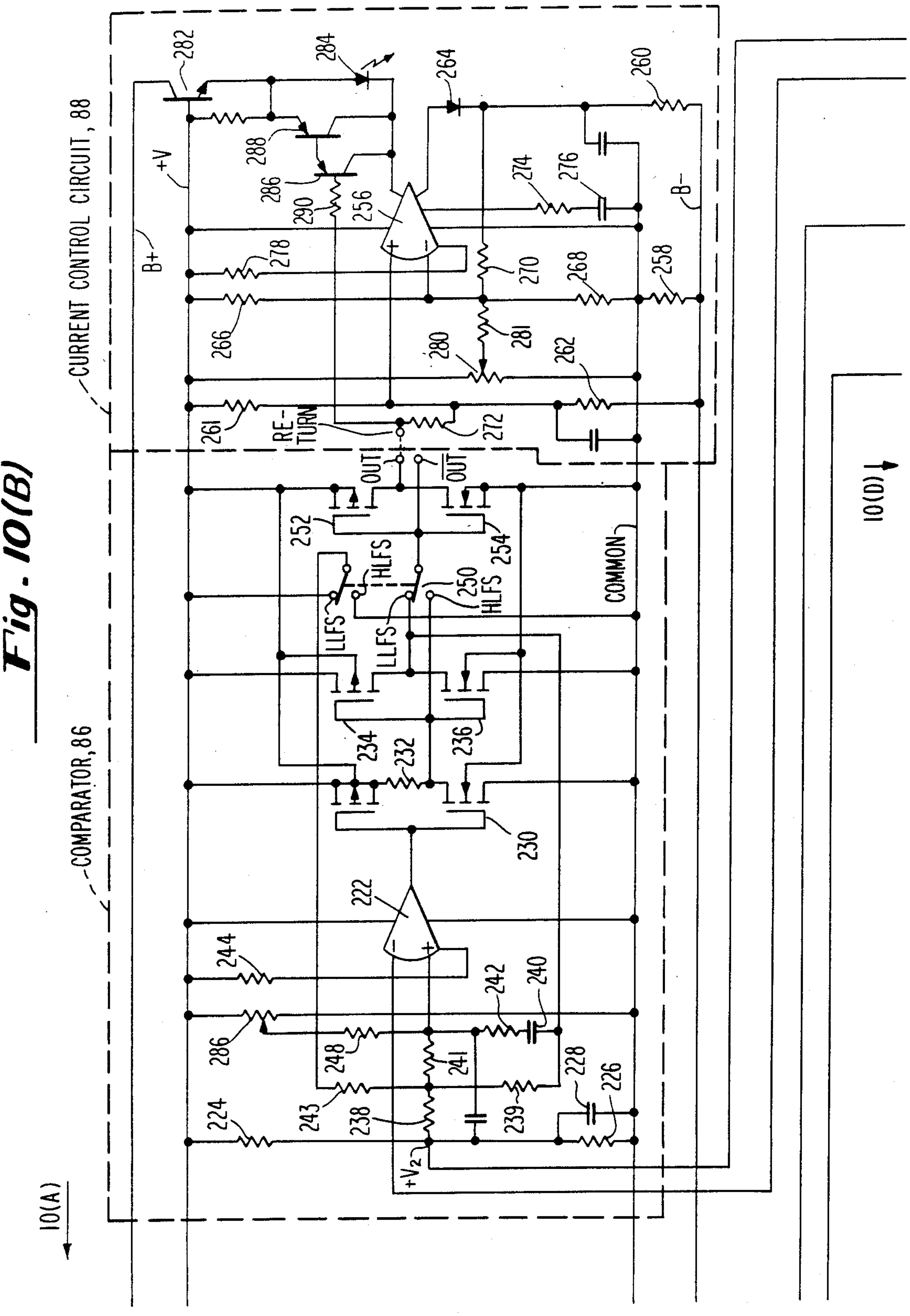
Figure 10C:
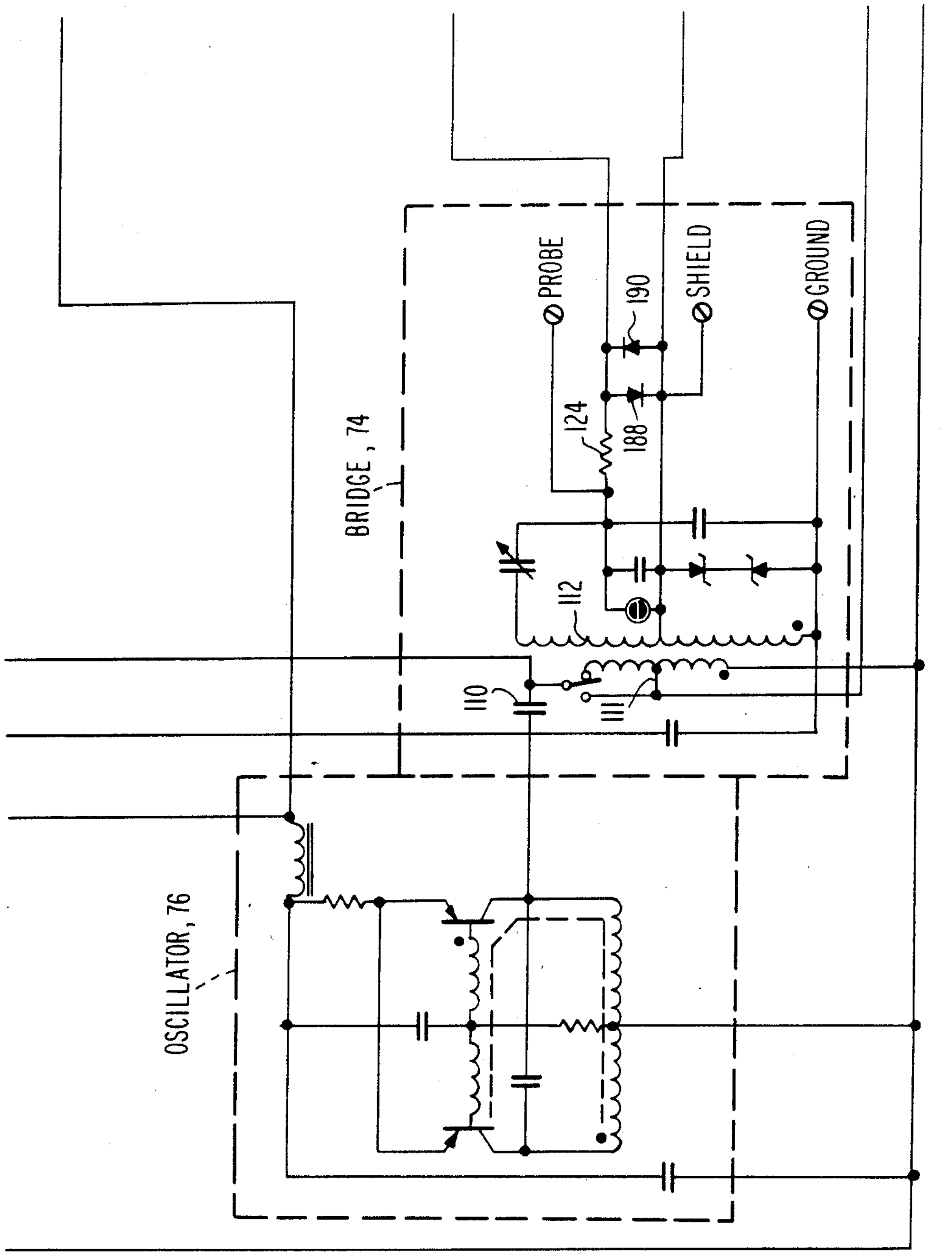
Figure 10D:
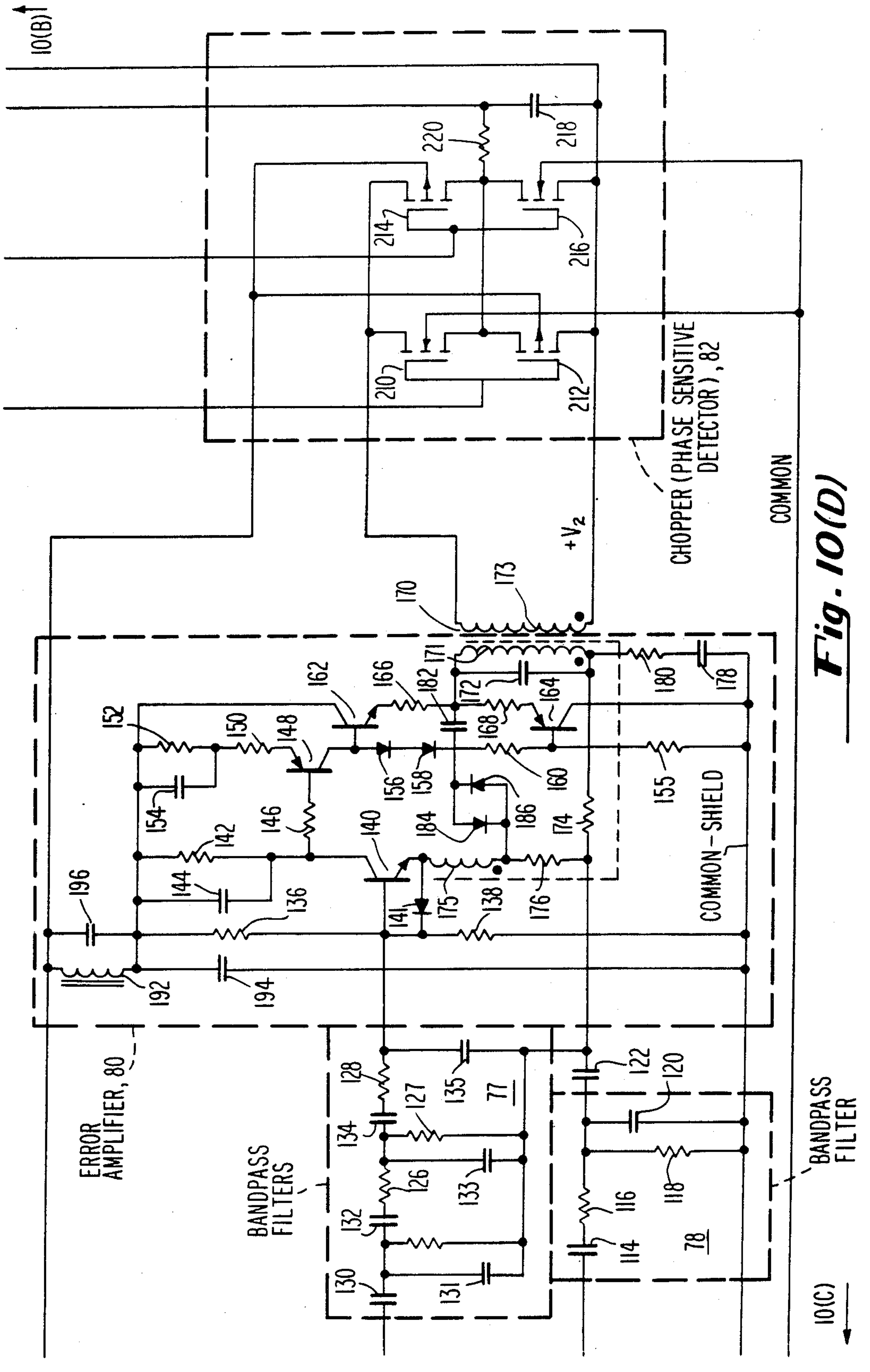

FIG. 9 shows a block diagram of a preferred embodiment of the admittance-responsive transmitter 1 of FIG. 3. It should be noted that some of the signal-processing methods shown are similar to methods shown in U.S. Pat. No. 3,993,947 to Maltby et al. Other transmitter embodiments in accordance with this invention might use signal-processing methods shown in U.S. Pat. No. 4,146,834 to Maltby et al, which is herein incorporated by reference. This transmitter uses a radio frequency admittance bridge to measure an admittance input. The transmitter 1 controls the current in a pair of signal wires to be one of two values depending on whether the measured admittance is greater than or less than a set-point. The transmitter 1 is configured so that it may receive its input power from the same pair of signal wires 32 which carries its output current (that is, it is arranged as a two wire transmitter). The signal wires 32 are connected to an input network 30 which contains voltage and current limiting means and rectification means. Voltage and current limiting is desirable to protect the circuitry of the transmitter 1 against inadvertent connection of high power to the signal wires 32, in accordance with one object of the invention, and to limit the power available to the transmitter circuitry, so as to enable said circuitry to be intrinsically safe, in accordance with another object of this invention. Rectification allows the unregulated supply potentials B+ and B− to have the proper polarity regardless of the polarity of the signal wires 32, and can also be arranged to interchange redundant transmitters on a single pair of signal wires by reversing their polarity. Alternatively, redundant signal wires can be interchanged by interconnecting them with rectifier means and reversing their polarity. A voltage regulator 34 provides a source of constant voltage from which the rest of the circuitry is powered. A radio frequency oscillator 36 provides a stable sinusoidal output which is coupled to the primary winding of bridge transformer 38 by capacitor 40, which limits the power available to the bridge. The secondary winding of transformer 38 is the fixed side of the admittance bridge with a tap "SH" serving as the bridge reference. The variable side of the bridge consists of admittance A to be measure and variable capacitor 42 which determines at what value of admittance A the bridge will be balanced, thus acting as a setpoint adjustment. An unbalance or error voltage at the oscillator frequency is developed across capacitor 44, which is connected between the sensing point "PR" and the bridge reference "SH". This error voltage is proportional to the difference between the admittance being measured and the admittance which would cause the bridge to be balanced, and thus is a measure of the admittance A. Capacitor 44 linearizes the change in error voltage per change in admittance A (which may be termed the bridge gain) and tends to hold this bridge gain constant in spite of changes in setpoint and conditions at the sensing element. Because the bridge balance condition is independent of the amplitude of the voltage applied to the bridge, it will be most advantageous to have the transmitter switch its output state near bridge balance. This will also enable the transformer tap "SH" to serve as a guard to drive the shield of the coaxial cable and guard shield of the sensing element of FIG. 3 since the voltage at this tap will be substantially equal to the voltage at the bridge's sensing terminal PR (which will be connected to the center wire of the coaxial cable of FIG. 3) at the transmitter's switching point. Diodes 46 and 48 and Zener Diodes 50 and 52 serve the dual functions of limiting the voltage available to the sensing and guard terminals for intrinsic safety purposes and of preventing damage to the transmitter circuitry due to high voltage transients which may be applied to the sensing element under certain circumstances. A tap in the primary of bridge transformer 38 makes available a common-referenced A.C. voltage which is termed "common-shield" and is equal to the ground-referenced shield voltage at the tap on the secondary of transformer 38. The voltage at the sensing point PR is filtered to common-shield by a bandpass filter 54 and applied to the positive input of an error amplifier 56. Bandpass filtering to common-shield removes signals at frequencies other than the oscillator frequency (such as radio frequency interference picked up by the sensing element and/or differences in voltage between the ground points of the sensing element and signal loop) and prevents oscillator-frequency current from being drawn from the sensing point by the filter network. The shield voltage is similarly filtered in bandpass filter 58 and applied through the feedback winding 60 of transformer 62 to the negative input of error amplifier 56. The error amplifier 56 is powered from a supply which is D.C. referenced to common but has an A.C. potential equal to the shield potential. This is accomplished by connecting the negative supply input of the error amplifier 56 to common-shield and connecting the positive supply input of the error amplifier 56 through a bandstop filter 64 to +V. The output of the error amplifier 56 is an amplified version of the error signal across capacitor 44 and is substantially free of spurious components at frequencies other than the oscillator frequency. Amplification is required because the bridge output is typically too small and/or at too high an impedance for accurate processing. The output of the error amplifier 56 is transformer-coupled to a phase-sensitive detector or chopper 66 so that the chopper 66 may be common-referenced. The chopper 66 is gated by a chopper drive 68 which provides a square wave drive signal at the oscillator frequency, its phase relationship to the bridge voltage being determined by the requirements of the admittance measurement. The chopper drive 68 receives a frequency and phase reference from the primary of the bridge transformer 38. The chopper drive output may be shifted in phase from the bridge voltage to detect admittances of a particular phase angle (for example, as shown in U.S. Pat. No. 3,746,975 to Maltby) or to compensate for phase shifts introduced by the bandpass filters 54, 58 and error amplifier 56. The output of the chopper 66 is a D.C. voltage proportional to the bridge unbalance caused by the component of the admittance A with a particular phase angle. This D.C. voltage is applied to an output amplifier 70 which performs two functions. First, the D.C. voltage is applied to an electronic switch which changes its output state when the D.C. input crosses a switching point near zero volts (which corresponds to bridge balance). The switch output controls an amplifier which maintains the signal current at one of two levels depending on the state of the switch. Thus the transmitter of FIG. 9 provides in normal operation one of two output currents in a two-wire signal loop, said output currents representing the condition of materials in a remote vessel as determined by a guarded radio-frequency admittance measurement.

Before describing an implementation of the transmitter of FIG. 9, a discussion of some of the constraints imposed by the objects of the invention will be undertaken. One constraint is on the power available to operate the transmitter circuitry. Typical intrinsically safe two-wire current loops operate with a maximum of 20 milliamps of signal current. One may take this as a reasonable high-current state $I_H$ for the transmitter. In order to have the low-current state $I_L$ of the transmitter widely separated from both the high-current state $I_H$ and the low-current failure state of 0 milliamperes, one may choose $I_L = 10$ milliamperes. Intrinsically safe signal loops are typically powered from a 24 volt source. The voltage burden imposed by loads, signal wire losses, and intrinsic safety barriers may allow only 12 volts at the signal terminals of the transmitter. This implies a maximum power of (12 V) (10 mA) = 120 mw available to power the transmitter circuitry. This low available power must be taken into consideration in a practical realization of the transmitter of FIG. 9. For instance, the oscillator must have a high efficiency of conversion of D.C. to R.F. In addition to quiescent power, the oscillator must also supply power to the bridge circuit. Substantial bridge loading may occur due to the presence of conductive material to be measured between the guard electrode of the sensing element and ground. Were the oscillator required to support a typical guard potential of 2 Vrms across a guard to ground resistance which may be as low as 10 ohms, 200 mW would be required. This is more than the power allotted to the whole transmitter. The guard voltage could be decreased to lower the required bridge power, but this would require more error amplification to achieve the same signal level at the chopper, and increasing the gain of the error amplifier may require additional power consumption in it. The chopper drive requirement of producing fast-rising square waves at radio frequencies makes it likely to consume substantial power. Finally, power must be conserved in the switching amplifier in the output stage.

Another constraint on a practical implementation is intrinsic safety. A system is intrinsically safe for use in a location containing particular easily-ignited materials if it is incapable of releasing sufficient energy to ignite those materials in their most easily ignited concentrations. For a system as in FIG. 3, this has two implications. First, when the signal wires are powered from an intrinsically safe power source, energy storage in the signal wires, transmitter, coaxial cable, and sensing probe must be limited. Second, when the signal wires are powered from a non-intrinsically safe power source, the transmitter design should make it highly unlikely that hazardous energy levels inadvertently applied to the signal wires will be applied to the probe, which is often in a flammable environment. Two courses may be taken to achieve an intrinsically safe circuit. First, the circuit may be isolated by protective components which by virtue of their construction are judged unlikely to fail in a way which would cause a loss of isolation. Second, the circuit may require a certain number of faults to allow hazardous energy levels. By judicious choice of components unlikely to fail and the minimum number of faults necessary to get hazardous energy levels in a circuit, the probability of getting hazardous energy levels in a circuit may become negligibly small and the circuit may be considered intrinsically safe.

A further consideration for a practical transmitter is immunity to radio frequency interference. Such interference may be caused by radio transmitters used for communication in industrial environments and may cause an incorrect indication of the condition of materials. A further consideration for a practical transmitter is its ability to withstand high voltage transients which may be applied to the signal wires, for example, by current transients in nearby power conductors, or applied to the probe, for example, by static-generating materials to be measured such as plastic pellets.

A practical implementation of the transmitter of FIG. 9 is shown in FIG. 10. Its operation and mechanisms for achieving the objects of the invention will be discussed block by block below.

An input network 72 provides points of connection for the signal wires carrying the transmitter's input power and output current. Series resistors 100 and 101 provide current limiting into the transmitter. Diodes 102, 103, 104 and 105 arranged as a full-wave bridge rectifier render B+ positive to B− thus giving a unipolar unregulated supply regardless of the signal wire polarity. Zener diode 106 limits the voltage between B+ and B− thus protecting the circuitry from high voltage transients on the signal wires. Diode 108 prevents B− from going more than one diode drop positive to ground, and diode 107 prevents B+from going more than one diode drop negative to ground. The input network requires that there be a fault in it in order to allow high voltage inadvertently applied to the signal wires to be connected to B+ or B−. To this end, resistors 100 and 101 should be of a type which will fail open-circuited (such as wirewound) and diodes 106 through 108 should not fail open when conducting the maximum current which can exist through resistors 100 and 101. With no faults in the input network, a large positive voltage from the positive signal input to ground will cause current to flow through resistor 100 and diodes 102, 106, and 108 so that B+ cannot be positive to ground by more than diode 102's Zener voltage plus diode 108's forward voltage drop. Similar clamping will occur with a large positive voltage at the negative signal input, with current flowing through resistor 101 and diodes 105, 106, and 108. A large negative voltage from the positive signal input to ground will cause current flow through diodes 107, 106, 103, and resistor 100 so that B− cannot be negative to ground by more than diode 106's Zener voltage plus diode 107's forward voltage drop. Similar clamping will occur with a large negative voltage at the negative signal input, with current flowing through diodes 107, 106, 104, and resistor 101. Thus, the unregulated supply potentials B+ and B− are limited by the input network 72.

The bridge circuit 74 has been discussed in relation to the block diagram of FIG. 9. Excluded from that discussion was the role of capacitor 110 in the circuit. Capacitor 110 limits the power that the bridge 74 can draw from the oscillator 76, thereby allowing low-power intrinsically safe two wire operation. A probe 4 (FIG. 3) as in U.S. Pat. No. 3,879,644 ignores the effects of conductive coatings on it by means of a guard shield electrode 5 interposed between the sensing electrode 9 and ground. So long as the guard shield 5 is driven at substantially the same potential as the sensing electrode 9, there will be negligible current flow in a coating on such a probe 4. In the prior art, such as U.S. Pat. No. 3,879,644 the potential of the guard shield 5 is maintained by a low-impedance drive such as a buffer. This is done so that resistance from shield 5 to ground does not unbalance the bridge. Since the resistance between shield and ground may be quite low (10 ohms with a typical probe covered by a conductive material), considerable power may be expended in this resistance to maintain the shield at sensing electrode potential. The bridge of this invention avoids such power dissipation by capacitively coupling, via capacitor 110, the primary of the bridge transformer 112 to the oscillator 76. Shield to ground resistance is reflected into the primary of transformer 112 according to the square of the turns ratio thereof. With no shield to ground load, the primary is near full oscillator voltage and little power is dissipated. With zero ohms shield to ground, the RF current drawn from the oscillator is limited by the reactance of capacitor 110, but again no power is dissipated since the load is zero, and the bridge voltage is zero. Maximum power dissipation occurs when the reflected load is equal to the reactance of capacitor 110 and here the bridge voltage is 0.7071 times its no-load value. Thus the power drawn from the oscillator 76 is limited, but at the expense of bridge voltage. Since the bridge gain is directly proportionate to bridge voltage, sensitivity is lost as the bridge is loaded. However, since a material which causes a low shield to ground resistance will also cause a large change in admittance from the sensing electrode 9 to ground as material covers or uncovers the probe, the loss in sensitivity occurs under conditions when extreme sensitivity is not needed. Thus the bridge sensitivity is varied automatically to match tbe characteristics of the material being measured. It is to be noted that, so long as the transformer windings are well coupled and of suitably low resistance, a varying bridge voltage due to varying load from shield to ground will not change the balance of the bridge. Thus, the setpoint of the transmitter and the effectiveness of the shield do not change with shield to ground load.

Capacitor 114, resistor 116, resistor 118, capacitor 120, capacitor 122, resistor 174, and resistor 180 form a three pole bandpass filter 78 whose passband is centered at the frequency of oscillator 76. This filter 78 attenuates signals of frequencies other than the oscillator frequency which may occur on the bridge reference point "shield" (such as radio-frequency interference picked up by the shield of the coaxial cable connecting to the probe) and applies the filtered bridge reference to the negative input of an amplifier circuit 80. Resistors 124 through 128, 136 and 138, and capacitors 130–135 form a 6-pole bandpass filter 77 whose passband is centered at the oscillator frequency. This filter attenuates signals at frequencies other than the oscillator frequency which may occur at the bridge sensing point labelled "probe". The filtered bridge sensing potential is applied to the positive input of the above-mentioned amplifier circuit. The amplifier circuit shown is basically a buffered compound Darlington amplifier with transformer feedback. Resistors 136 and 138 provide a bias voltage at the base of input transistor 140 and a final shunt resistance for the 6-pole bandpass filter 77. Transistor 140 provides a first stage of voltage gain and develops its output across load resistor 142. Capacitor 144 rolls off the gain of the first stage at a frequency somewhat above the oscillator frequency to prevent parasitic oscillation. The first stage output is applied through resistor 146 to the base of transistor 148 which provides a second stage of voltage gain. Diode 141 and resistor 146 protect transistors 140 and 148 from damage due to high transient voltages which may occur in bridge 74. The emitter network of transistor 148 consists of resistor 150 and resistor 152 which is by-passed by capacitor 154 so that the quiescent current, D.C. gain and A.C. gain may be set independently. Transistor 148 develops its output across load resistor 155. Bias network diodes 156 and 158 and resistor 160 bias the complementary buffer transistors 162 and 164 into partial conduction with currents determined by the bias voltage and the value of emitter resistors 166 and 168. Bias network diodes 156 and 158 provide temperature compensation of the base-emitter voltages of transistors 162 and 164. Transistors 162 and 164 drive the primary winding 171 of transformer 170, which has an output winding 173 to couple the output to the chopper 82, and a feedback winding 175 to set the closed-loop gain of the amplifier 80. The transformer 170 is resonated by capacitor 172. D.C. feedback to stabilize the operating points of the amplifier transistors is provided by a D.C. path through the primary 171 of transformer 170, resistors 174 and 176 and the feedback winding 175 of transformer 170, to the emitter of transistor 140. This feedback path establishes a quiescent voltage at the amplifier output which is stored on capacitor 178, thus enabling the amplifier to provide a bipolar output. As the required value of capacitor 178 may be large, resistor 180 is placed in series with capacitor 178 to limit the peak current therein for intrinsic safety purposes. It is therefore desirable that the junction between capacitor 178 and resistor 180 be protected, such as by potting, to form a 2-terminal intrinsically-safe component.

In typical on-off applications the admittance of the sensing element may be so large that the bridge unbalance overloads the error amplifier 80. When this happens, phase shifts in the error amplifier 80 may cause the signal presented to the phase-sensitive detector (chopper) to indicate the wrong material condition. This situation is prevented by a limiting network comprising capacitor 182 and diodes 184 and 186, which prevents the amplifier from saturating or cutting-off with the input signal allowed by diodes 188 and 190 by providing substantially 100% feedback when diodes 184 and 186 conduct. The error amplifier 80 is powered by a supply which is D.C. coupled to +V and common (through inductor 192 and transformer 112) but driven with an RF voltage equal to the shield voltage via the "common-shield" tap 111 on transformer 112. The error amp supply voltage, stored on capacitor 194, is A.C. isolated from +V by a tank circuit parallel resonant at a frequency near that of oscillator 76, consisting of inductor 192 and capacitor 196. Thus inductor 192 and capacitors 194 and 196 constitute a bandstop filter at the frequency of oscillator 76.

The chopper drive circuit 84 provides two square waves at the frequency of oscillator 76, 180° out of phase with each other, and at a preset phase relationship to the voltage at the primary winding of transformer 112 in order to gate the chopper circuit 82. The chopper drive circuit 84 consists of a first CMOS transistor pair 198 and 200 with an input network to select the phase relationship to the bridge (identical to the input network in FIG. 3 of U.S. Pat. No. 3,993,947) and two CMOS transistor pair inverting amplifiers 202, 204, and 206, 208 to provide the opposite-phase power-supply-rail to power-supply-rail square waves required. The two phase relationships of particular interest are (1) in phase with the bridge voltage, used typically with horizontally-mounted probes as in U.S. Pat. No. 3,879,644, and (2) leading the bridge voltage by 45°, used with vertically-mounted insulating probes in conductive liquids which tend to coat probes. The action of such a 45° phase is to eliminate the detection of such a conductive coating and is described in U.S. Pat. No. 3,746,975.

In the chopper circuit 82, MOSFET transistor pairs 210, 212 and 214, 216 provide phase-sensitive detection of the amplified error signal at the output winding 173 of transformer 170. Transistors 214 and 216 are driven by a signal in phase with that at the gates of chopper drive input transistors 198 and 200, and transistors 210 and 212 are driven with an inverted version of this signal.

The use of parallel N-Channel and P-Channel transistors is especially advantageous when these transistors are part of an integrated array such as the CD 4007 used in the preferred embodiment. In such an array the N-Channel substrates must be connected to the lowest potential and the P-Channel substrates to the highest potential that will be applied to the array. The sources of the chopper transistors are connected to either the chopper reference $+V_2$, which is between +V and common, for proper operation of the output amplifier, or to the voltage being chopped, which is near the reference $+V_2$. Under these circumstances (substantial reverse substrate bias) the transistors require more forward gate bias to enhance conduction of the transistors. The total substrate bias (that of the P-Channels plus that of the N-Channels) is approximately +V, and is apportioned between the two types by the value of $+V_2$. That is, the substrate bias of the N-Channels is $+V_2$ and that of the P-Channels is $(+V)-(+V_2)$. As the value of $+V_2$ is subject to variation as a result of component tolerance, time and temperature effects, and, in the circuit under discussion, the state of the output, it is important that such variation not cause a loss in chopper function. The chopper shown is not subject to such a loss. If $+V_2$ is near common, the N-Channel transistors 210 and 216 will have a small substrate bias and will be able to alternately enhance. The same is true of P-Channel transistors 212 and 214 if $+V_2$ is near +V. The above is true so long as the gate has more of an effect on channel conduction than does the substrate. The chopper transistors are connected to a low-pass filter comprising resistor 220 and capacitor 218, which stores a voltage with respect to $+V_2$ equal to one half the average value of the amplified error signal during the conduction period of transistors 210 and/or 214, assuming a 50% chopper drive duty factor. The "half" occurs because during half a cycle (the conduction period of transistors 212 and 216) the filter input is connected to the reference $+V_2$ in order to minimize noise susceptibility during this time.

The output amplifier comparator circuit 86 performs two functions: threshold detection of the chopper output, and control (through current control circuit 88) of the current drawn by the transmitter. Threshold detection is accomplished by operational transconductance amplifier (O.T.A.) 222 and its associated circuitry. Resistive divider 224, 226 generates reference voltage $+V_2$ which biases the positive input of O.T.A. 222 and to which the chopper output is referenced. Capacitor 228 provides $+V_2$ with a low A.C. impedance. The chopper output is applied directly to the negative input of the O.T.A. 222. A change in state of the threshold detector is initiated by the voltage at the negative input of the O.T.A. 222 crossing the voltage at the positive input. One may describe such a change in state by assuming an initial condition of the negative input being higher than the positive input. This corresponds to a saturated negative output of the O.T.A. 222, transistor 230 being not enhanced, pull up resistor 232 holding the gates of transistors 234 and 236 at +V, and the output of the threshold detector (at the drains of transistors 234 and 236) at common. With the output of the threshold detector at common, a feedback voltage is developed across resistor 238 by the current through resistor 239 causing the positive input of the O.T.A. 222 to be lower than $+V_2$ by this amount. As the voltage at the negative input becomes slightly lower than that at the positive input, the O.T.A. 222 begins to source current to the gate capacitance of transistor 230 causing its voltage to increase. This enhances transistor 230 and lowers the voltage on the gates of transistors 234 and 236 causing the threshold detector output to increase. The increasing output is coupled to the positive input of the O.T.A. 222 through capacitor 240 and resistor 242 so as to develop a positive voltage across resistors 238 and 241, and thus further unbalance the inputs of O.T.A. 222. This positive feedback continues until the threshold detector output is at +V and cannot increase further. This positive feedback, which is large compared to the voltage developed across resistor 238 through resistor 239, insures that the circuit will switch fully and reduces the noise susceptibility during switching. In addition to the capacitive positive feedback just described, the threshold detector output is coupled through resistor 239 to resistor 238, where the voltage developed provides input hysteresis so that the threshold detector will not be retriggered by input noise as soon as the capacitive feedback has decayed. This D.C. feedback voltage across resistor 238 will, after the output transition, be increased by the change in threshold detector output (substantially +V) multiplied by resistance 238 divided by the sum of resistances 238 and 239 (neglecting the effect of resistor 243, which is much larger than resistor 238, and thus has little effect). This requires the chopper output to increase by this amount before the threshold detector will switch back to the initial conditions of this example. Other features of the circuit: resistor 244 supplies a programming current for programmable O.T.A.'s such as the CA 3080, potentiometer 246 and resistor 248 provide adjustment to compensate for input offset of the O.T.A. 222 and accumulated offset at the chopper output. Resistor 232 is used as a load for transistor 230 instead of a complementary MOS transistor because a complementary transistor would allow a large through current during transition which is at odds with low-power two wire operation. Fail-safe selector switch 250 connects either the output of the threshold detector or the gates of inverter transistors 234, 236 to the input of the inverter (transistors 252 and 254). The output of the inverter (transistors 252 and 254) is a low impedance D.C. level substantially at either +V or common, which drives the current control circuit. Switch 250 thus selects whether the transmitter current will be at $I_L$ or $I_H$ for a given direction of bridge unbalance, and also injects into the threshold detector an offset whose polarity changes with the fail-safe selection. In low level fail-safe, resistor 243 is connected to +V and sources current into resistor 238, while in high level fail-safe resistor 243 is connected to common and sinks current from resistor 238. The magnitude of the offset produced by resistor 243 is such that, with no chopper output, the threshold detector will be in the fail-safe state selected (for example, in high level fail-safe, transistor 254 will be enhanced when the admittance between the sensing element and ground is large, this corresponding to, e.g. a high level of material in a vessel). This is an important feature of this transmitter because any circuit defect which causes there to be zero chopper output will render the transmitter in its fail-safe state and the receiver connected to such a defective transmitter will take the least-damaging control action. Such a defect may occur in the oscillator, bridge, error amp, chopper drive, or chopper. Ideally, any defect in the transmitter would generate an invalid current level so that the loss of control action would become known to the system operators. This ideal response to a component failure is most closely approached by redundant system components and interconnections with comparison means to ensure that the indications of all systems are in agreement, and means to ignore defective systems if all systems are not in agreement. However, for a system not used in conjunction with redundant components and interconnections, the second choice for output of a defective transmitter is the fail-safe output.

The current control portion 88 of the output amplifier consists of an input bridge, an O.T.A. 256, and feedback components. The action of this circuit is to control the total current through the transmitter in response to the bistable output of transistors 252 and 254 to be either $I_L$ or $I_H$. The circuit does this by adding the appropriate amount of current to the quiescent current being drawn by the transmitter, which current is always less than $I_L$. Transmitter current is measured in two of the three places where it flows into B−. The current from the regulated supply flows through resistor 258 thereby developing a voltage thereacross representing the quiescent transmitter current. The current added by the output amplifier flows through resistor 260 thereby developing a voltage thereacross representing the added current. These voltages are fed back to the O.T.A. 256 so that a change in quiescent current generates an opposite change in the added current, thereby maintaining the total current of the transmitter independent of the quiescent current. The purpose of such a dual-point feedback scheme is to minimize the voltage drop across resistor 258. Any voltage thereacross decreases the voltage available in the rest of the signal loop which may be more profitably allocated to signal wire drops, load drops, etc. The third point of entry of current into B− is via resistor 262. This current is not controlled, but may be minimized by making the value of resistor 262 large. O.T.A. 256, which may be a CA3094 for low power consumption and high output capability, sources current through diode 264 and resistor 260 so as to balance its inputs. The voltage at the negative input of the O.T.A. 256 consists of a fixed portion from a divider comprising resistors 266, 268 plus a voltage proportional to the added current in resistor 260 which is injected via resistor 270. The voltage at the positive input of O.T.A. 256 consists of a fraction of the voltage between +V and B−, from a divider comprising resistors 261, 262, representing the transmitter's quiescent current, plus a component due to the voltage of CMOS pair 252, 254 which is applied via resistor 272. When transistor 254 is enhanced, a lower voltage is applied to the positive input of the O.T.A. 256 and a lesser amount ($I_L$) of transmitter current is required to balance the inputs of O.T.A. 256. When transistor 252 is enhanced, a higher voltage is applied to the positive input of the O.T.A. 256 and a greater amount ($I_H$) of current is required to balance the inputs. Thus the current control circuitry 88 controls the total transmitter current in response to the voltage at the output (drains) of CMOS pair 252, 254, which voltage in normal operation will be one of two values according to the admittance of the sensing element relative to a setpoint. All circuitry in FIG. 10 except the regulator 90 and current control 88 may be thought of as an electronic admittance responsive switch replacing in function the mechanical switch 26 and resistor 18 shown in FIG. 8. Other items shown in the current control circuit 88: an RC network consisting of resistor 274 and capacitor 276 provides phase compensation and resistor 278 provides bias for the CA3094 O.T.A. device 256 used in the preferred embodiment. Potentiometer 280 and series resistor 281 enable adjustment of $I_L$ and $I_H$. Transistor 282 enables the O.T.A. 256 to draw its added current from B+ instead of the regulated +V without being exposed to the voltage on B+. L.E.D. 284 provides a visual indication of transmitter output state by lighting when the added current flows in it in the high-current state. In the low-current state, added current bypasses LED 284 and flows in Darlington pair 286, 288 which is saturated because the output of transistors 252, 254 is at common and draws base current through resistor 290.

Figure 11:
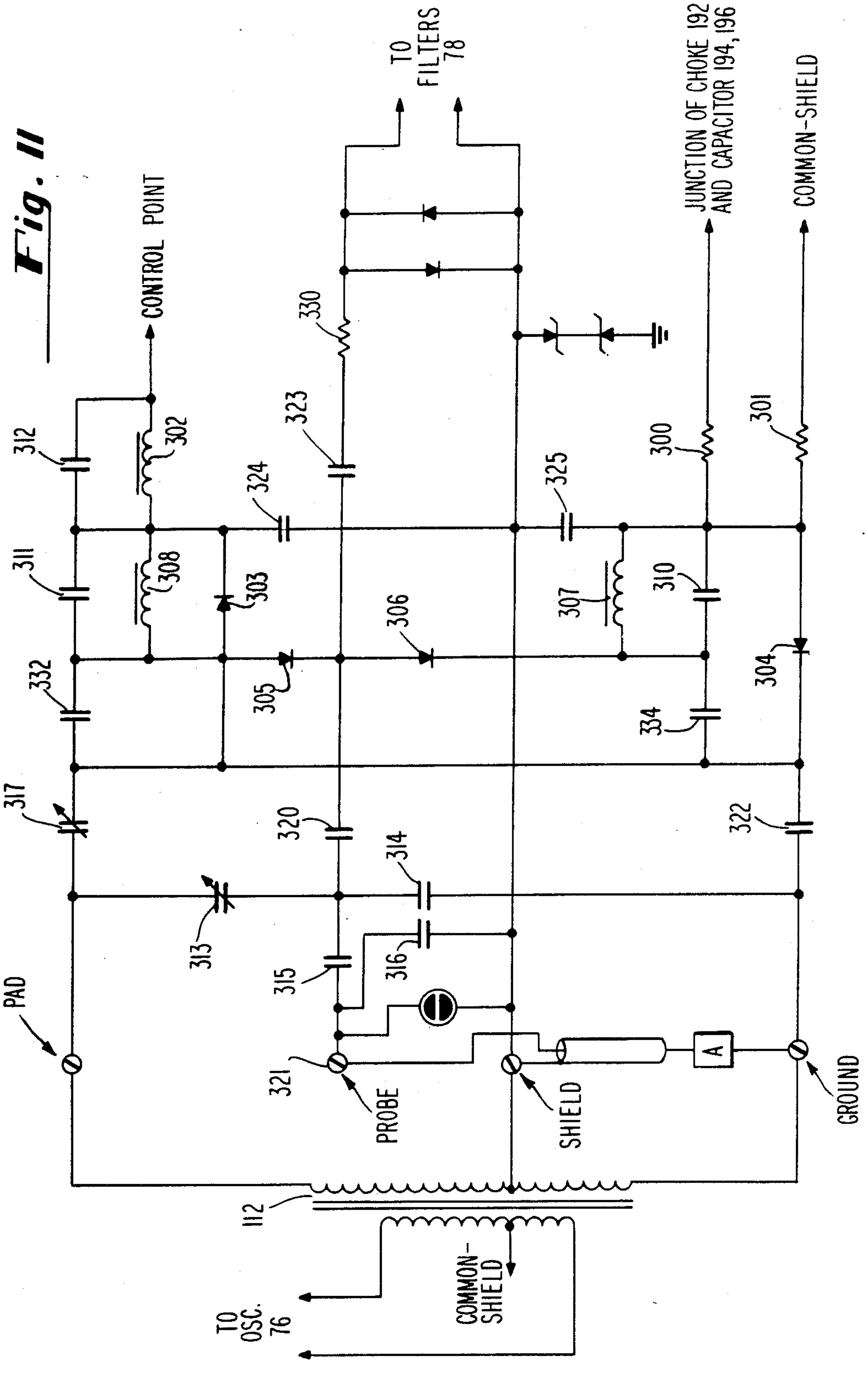
FIG. 11 is a schematic diagram of a bridge circuit whose sensitivity may be varied, and which may be used in place of the bridge in FIG. 10.

FIG. 11 is a schematic diagram of a bridge circuit which may be used in place of that shown in FIG. 10 and which allows the introduction of substantial hysteresis between the sensing element to ground admittance at which the transmitter switches from $I_L$ to $I_H$ and from $I_H$ to $I_L$ (i.e., which provides an adjustable differential). This bridge would find use where some control action is desired at two widely-separated levels of material in a vessel. For example, one may wish to draw material from a vessel until the level of material drops to a certain point, and then start a pump to refill the vessel, and then shut off the fill pump when the vessel is sufficiently full. This bridge is thus desirably used with a vertical probe which provides a substantially linear change in probe to ground capacitance with level. The bridge of FIG. 11 provides adjustable differential by diode-switching a capacitive unbalance in the bridge in response to changes in the output state of the transmitter. This bridge circuit may also be used wherever it is desired to electronically change the setpoint of the transmitter (for example, for monitoring level at several points along a single sensing element).

Operation of the diode switch is as follows: voltage divider comprising resistors 300, 301 across the error amp power supply (from the junction of choke 192 and capacitors 194, 196 to common-shield) provides a D.C. voltage of ½ +V which is at the same R.F. potential as the shield. When the control point (threshold detector output) is at common D.C. will flow through resistor 300, diodes 304 and 303 and inductor 302, causing diodes 303, 304 to be forward-biased and diodes 305, 306 to be reverse-biased. When the control point is at +V, D.C. will flow through inductors 302 and 308, diodes 305 and 306, inductor 307 and resistor 301, reversing the biasing of diodes 303, 304, 305 and 306. The control point is at common when the high admittance (high material level) switching point has been reached, and at +V when the low admittance (low material level) switching point has been reached. Tuned L-C circuits (302–312, 308–311, 307–310) provide oscillator-frequency isolation of the bridge from the control circuitry.

Operation of the bridge is as follows: transformer 112 provides bridge drive and a bridge reference voltage as in the bridge of FIG. 10. Variable capacitor 313 provides a zero adjustment (of the low-admittance switching point) by sourcing sufficient current to the zero-point probe admittance to make the probe voltage substantially equal to the reference (or shield) voltage. Capacitor 314 balances the residual capacitance of variable capacitor 313 so that the bridge may be balanced with zero probe-ground admittance. Capacitive divider 315, 316 reduces the gain of the bridge to accommodate larger differentials which are expected in adjustable differential applications.

Variable capacitor 317 sources a variable RF current which is connected to either the bridge output (junction of capacitor 323 and resistor 330) or to shield by the diode switch in response to the transmitter output state. When this current flows to shield it has no effect on the bridge, but when it is connected to the bridge output it develops an apparent error voltage across the capacitor 320. This requires additional current from the probe terminal 321 in order to re-balance the bridge output and switch the output state. Once the output switches to the state corresponding to high admittance the current in variable capacitor 317 is switched to shield and the bridge output is unbalanced in the high admittance direction, requiring a lessening of probe-ground admittance to rebalance and switch again. As the R.F. current in variable capacitor 317 is proportional to its capacitance, variation of its value constitutes a proportional adjustment of the differential of the transmitter. Capacitor 322 is included to balance the residual capacitance of variable capacitor 317 and allow the minimum differential. Connection of the current of capacitor 317 to the bridge output is accomplished by diodes 305 and 306 and capacitor 323, diodes 305 and 306 being forward biased when the control point is at +V and providing a low-impedance path from variable capacitor 317 to the bridge output. Conversely, diodes 303, capacitor 324, diode 304 and capacitor 325 provide low-impedance paths from variable capacitor 317 to shield when diodes 303 and 304 are forward-biased.

The circuit shown has the advantages of independent adjustment of zero and differential, and always switching near balance so that the transformer tap functions as an effective shield. Since the circuit is desirably used with vertical insulated probes when measuring conductive materials, 45° chopper phasing may be desirable when measuring conductive materials which tend to coat probes, so as to eliminate the effect of such coatings.

Figure 12:
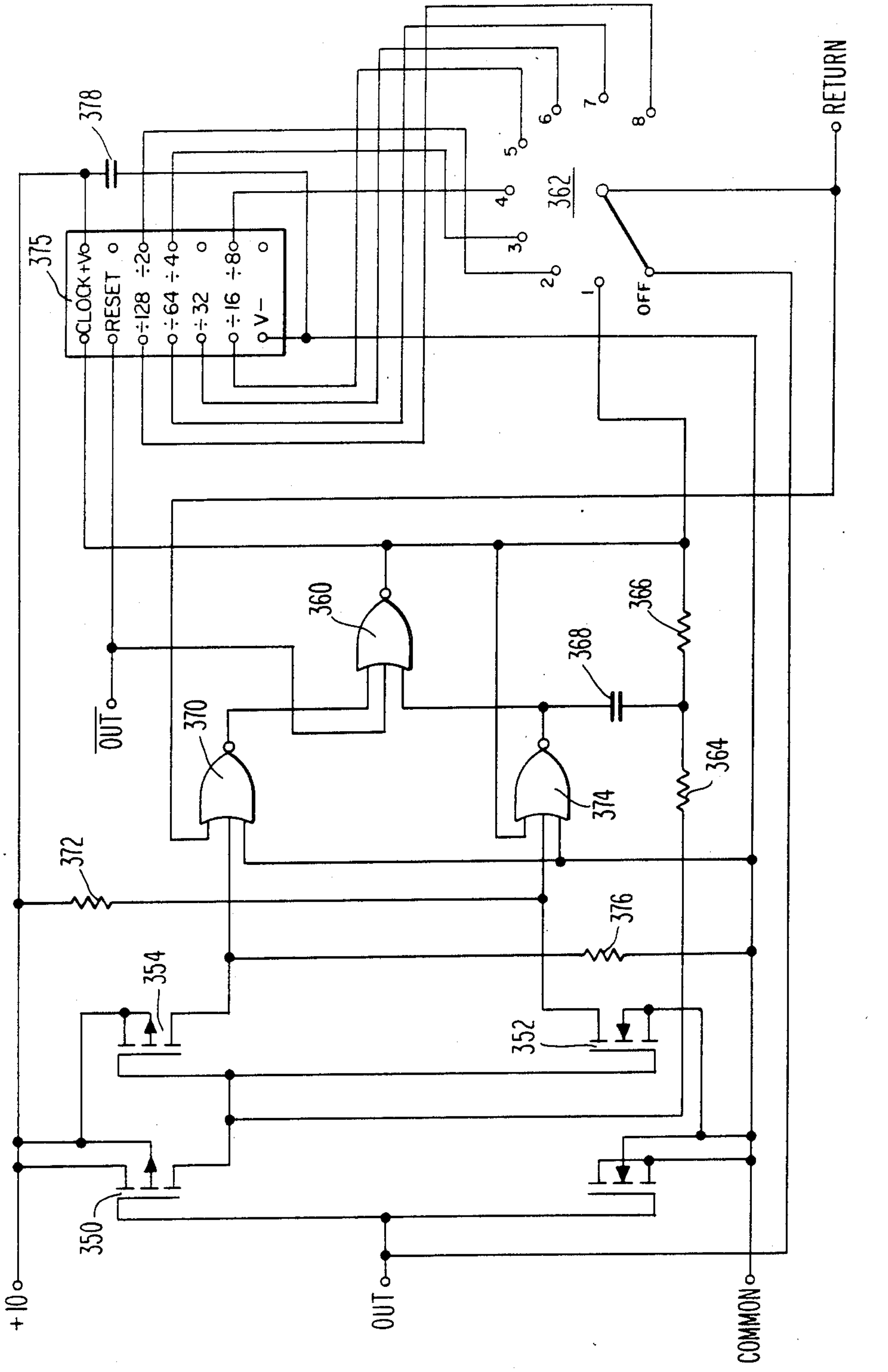
FIG. 12 is a schematic of a time-delay network which may be added to the output amplifier of FIG. 10.

FIG. 12 shows a time delay circuit suitable for use with the transmitter of FIG. 10. Time delay may be desired to prevent the transmitter from responding to rapid fluctuations in level such as may be caused by waves or agitation of the material being measured. The circuit shown generates a precise delay while drawing negligible power, thereby not compromising the low-power two wire capabilities of the transmitter of FIG. 10. The circuit is placed in the output amplifier of the transmitter of FIG. 10 between the threshold detector 86, which responds quickly to the level of materials, and the current control circuit 88, where a delay before response is desired. It is desirable that a time delay provides delay only on switching from the fail-safe state to the normal operating state; delay on switching to the fail-safe state may allow the material condition to occur that the transmitter was intended to prevent. The circuit contains a micropower slow clock, a series of cascaded CMOS binary dividers, and a switch to select the signal presented to the current control point "Return". The clock is controlled by the signal at "Out" which in FIG. 10 was directly connected to the current control terminal "Return", and by the signal at "$\overline{\text{Out}}$" which is always the opposite of "Out".

One may examine the operation of the time delay circuit by assuming that the transmitter has detected the fail-safe state. This means that "Out" is low and "$\overline{\text{Out}}$" is high. "Out" being low causes transistor 350 to be enhanced, which enhances transistor 352 and cuts off transistor 354. "$\overline{\text{Out}}$" being high causes reset of the binary divider circuit 375 (all outputs are at common) and forces the output of NOR gate 360 low. Thus all contacts of the switch 362 are low, so the current control circuit of the transmitter will generate the fail-safe current $I_L$.

As the circuit will assume the state described above as soon as "Out" and "$\overline{\text{Out}}$" are made low and high respectively, the circuit will not delay in switching to the fail-safe state. Provided resistor 364 is substantially smaller than resistor 366, the enhancement of transistor 350 will hold capacitor 368 discharged. When the threshold detector switches from the fail-safe state to the normal state, "$\overline{\text{Out}}$" will switch low and enable the binary divider circuit, and "Out" will switch high and cut off transistor 350. This allows the gate voltage of transistor 352 and 354 to decay exponentially with a time constant depending on resistor 366 and capacitor 368. When the gate voltage of transistor 354 crosses its threshold voltage it becomes enhanced, applying a high input to NOR gate 370 whereupon its output switches low. When the gate voltage further delays to the threshold voltage of transistor 352 it comes out of enhancement whereupon resistor 372 pulls up one of NOR gates 374's inputs, causing its output to go low. This ends the first half of the clock's cycle, presenting gate 360 with all low inputs, causing its output to go high. Should the delay selector switch 362 be in position 1, this high output of gate 360 will be presented to the current control terminal "Return" to generate the normal-state transmitter current $I_H$. When "Return" is high, the clock is also disabled, in a manner described later. Should switch 362 be in one of the positions connected to an output of the binary divider circuit, "Return" will remain low until the clock output causes that output of the divider to go high. The circuit of FIG. 12 is configured to use a negative-edge triggered binary divider 375 such as the CD4024. Thus, when the output of gate 360 goes high there is no change in the outputs of the binary divider 375. Transistors 350, 352, and 354 are desirably part of an integrated array such as the CD4007 which incorporate gate protection diodes. Thus, when gate 374 switches low at the end of half a clock cycle, and the voltage at the junction of capacitor 368 and resistor 364 falls well below that of common, capacitor 368 is rapidly discharged through resistor 364 and the gate protection network until the voltage at the junction of capacitor 368 and resistor 364 rises to within one diode forward drop of common, with no damage to the transistors. With gate 374 low and gate 360 high, capacitor 368 will charge exponentially through resistor 366 and its voltage will be applied to the gates of transistors 352 and 354 by resistor 364. As the voltage on capacitor 368 crosses the threshold voltage of transistor 352, it becomes enhanced and presents a low input to gate 374; as the voltage increases further, it crosses the threshold voltage of transistor 354 causing it to come out of enhancement and allowing resistor 376 to pull down the input to gate 370. At this point, either of two situations may obtain. In one case, "Return" will be high, indicating that the delay period is complete and that the transmitter is generating the normal-state current $I_H$. In this case, the output of gate 370 is low due to "Return" being high, and the cutting-off of transistor 354 has no effect on the output of gate 374. Thus the clock stops. Alternatively, "Return" will be low, indicating that the delay interval has not been completed. In this case, cutting off transistor 354 causes gate 370 to have all low inputs, and its output goes high, causing gate 360's output to go low. This negative-going transition of gate 360 toggles the binary divider network 375 causing it to increment one count. The transition also presents gate 374 with all low inputs, causing its output to go high, latching the output of gate 360 low, and forcing the voltage at the junction of capacitor 368 and resistor 364 well positive with respect to +V. Capacitor 368 is partially discharged through resistor 364 and the gate protection network. This leaves the clock in the condition initially described and thus indicates the completion of the clock cycle. The clock will continue to run until "Return" goes high at the end of the delay period or the threshold detector switches back to the fail-safe state, whichever occurs first.

As shown, each switch position gives twice the delay of the next lowest position. Thus, if the clock has a 2 second period, switch position 1 will give a 1 second delay, position 2 a 2 second delay, position 3 a 4 second delay, position 4 an 8 second delay, etc. While this scheme provides sufficient resolution for most level-sensing applications, it may be desirable in some situations for the switch to add a constant delay with each increment of switch position. This may be accomplished by well-known techniques of gating the output of the binary divider 375 with a coded switch input. Also, very long delays may be attained simply by increasing the number of dividers.

The delay generator of FIG. 12 gives long, stable delay times while consuming negligible power and without the use of a large timing capacitor. These benefits accrue from the use of CMOS as well as the configuration of the circuit. The CMOS binary divider network consumes power only when one of its divider is switching. Since its transition time is short compared to reasonable (on the order of 1 second) clock periods, the divider consumes little power. Current pulses during switching are decoupled by capacitor 378. Use of CMOS for gates 360, 370, and 374 provides rail-to-rail output swings for stable charging rates while consuming little power. Use of large drain resistors for transistors 352 and 354 limits current drain and requires little change in gate voltage for rail-to-rail drain voltage swings. The high input impedance of transistors 352 and 354 allows resistor 366 to be large, which in turn allows capacitor 368 to be small for a given clock period. Since small-value capacitors are generally more stable than large-value ones, this enhances the stability of the delay time. Also, a small-value capacitor 368 will not compromise the intrinsic safety of the circuit.

Figure 13A:
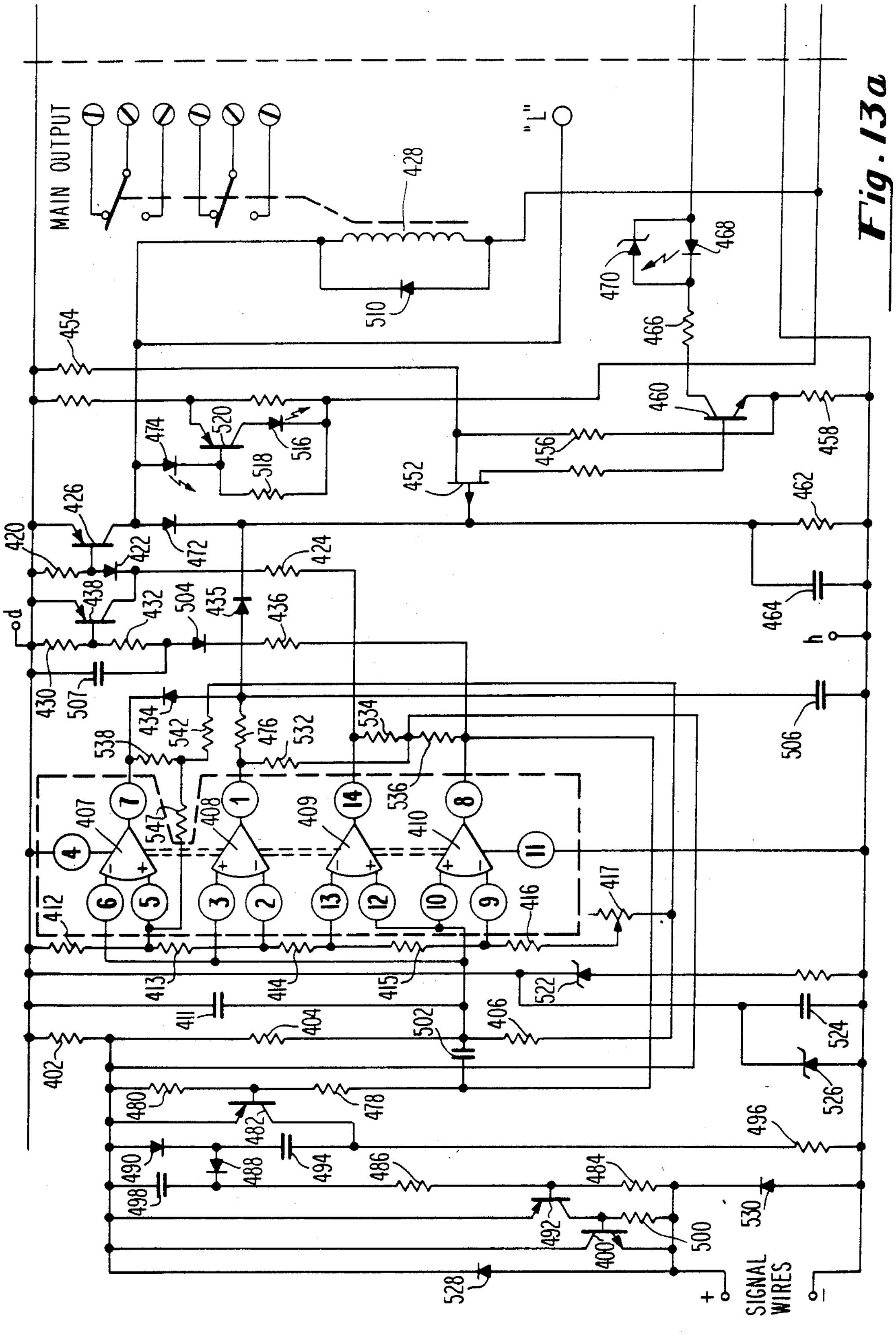
FIG. 13 (comprising FIGS. 13(A) and (B)) is a schematic of a receiver circuit having the transfer function shown in FIG. 6
Figure 13B:
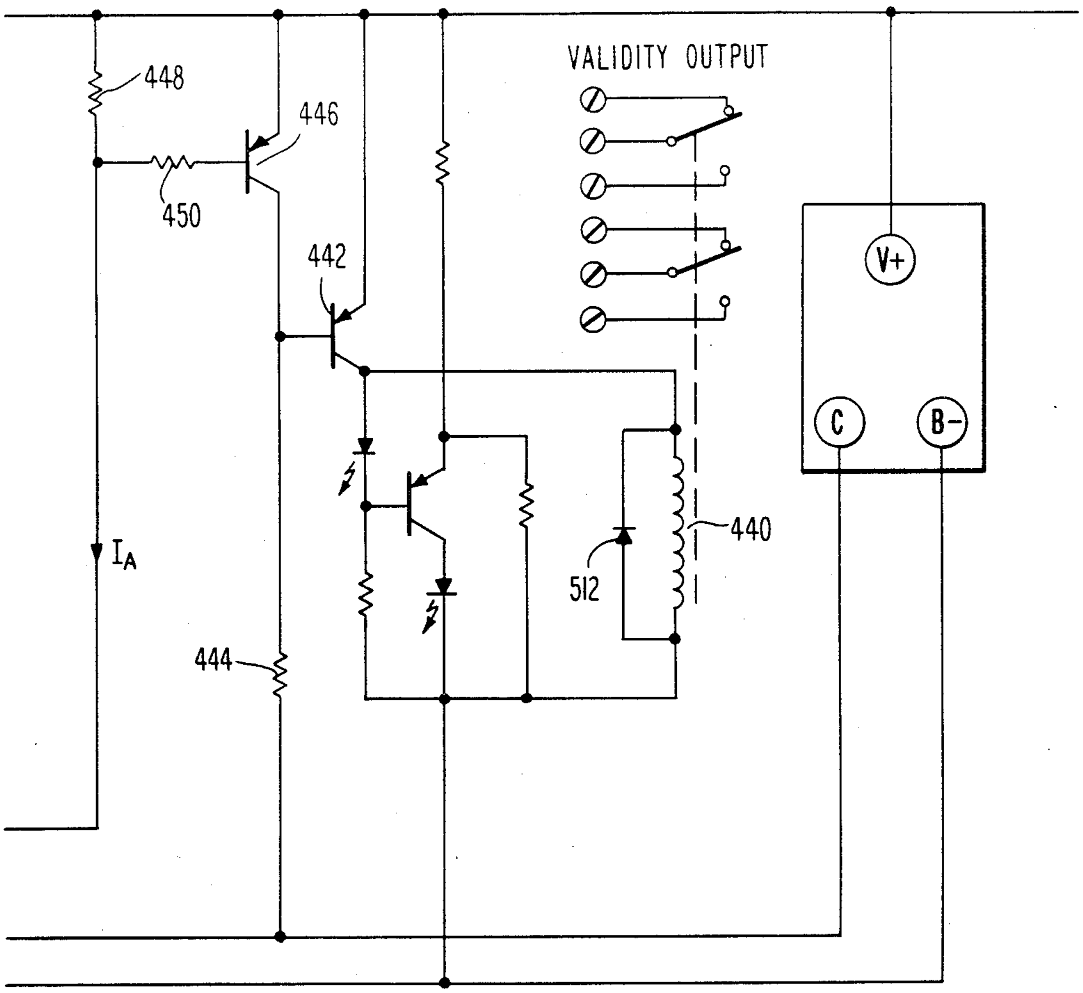

FIG. 13 shows a receiver schematic which will have a transfer function as in FIG. 6. The circuit has the following functions: sensing of the current drawn by a transmitter, generating the transfer function of FIG. 6, driving of the main output and validity output, and resetting latching intrinsic safety barriers. Considering operation when the barrier-reset circuit is not in the reset mode: under these circumstances, transistor 400 will be turned on and form a low-impedance path from the positive connection to the signal wires to resistor 402. Current drawn from the positive signal wire flows through sensing resistor 402, developing across it a voltage proportional to the drawn current. This voltage is divided by resistive divider 404, 406 and presented to an input of each of four operational amplifiers 407–410. If, as in a preferred embodiment an integrated circuit LM348N is used to provide the four op-amps 407–410, the pin connections are as indicated by the circled numbers 1–14. This voltage is also low-pass filtered by capacitor 411 so that high frequency unwanted signals such as RFI or induced transients are not presented to the op-amp inputs. The other inputs of the op-amps 407–410 are connected to taps in the reference divider chain comprising resistors 412–417. The tapped voltages in this chain are made to correspond with the voltages which will exist at the junction of resistors 404, 406 when the current drawn in the positive signal wire is one of the validity output switching currents $I_X$, $I_Y$, $I_s$, $I_{s'}$, shown in FIGS. 5 and 6. The op-amps 407–410 function as comparators, one op-amp changing state at each of these switching points. The output of op-amp 407 is low when I is less than $I_X$ and high when I is greater than $I_X$, op-amp 408 is high when I is less than $I_Y$ and low when I is greater than $I_Y$, op-amp 409 is high when I is less than $I_s$ and low when I is greater than $I_s$, and op-amp 410 is high when I is less than $I_s$, and low when I is greater than $I_{s'}$. When I is between $I_s$ and $I_{s'}$ the output of op-amp 409 is low and current is drawn through resistor 420, diode 422, and resistor 424 thereby forward-biasing the base of transistor 426 and causing the main output relay 428 to be energized. Current less than $I_s$ causes op-amp 409's output to be high and transistor 426 to be cut off, causing the relay 420 to be de-energized. Current greater than $I_{s'}$ causes the output of op amp 410 to be low, drawing current through resistor 430, resistor 432, diode 504 and resistor 436. This saturates transistor 438 and prevents the base of transistor 426 from being forward-biased, thus causing the main output relay 428 to be de-energized. Thus the circuit has a main output transfer function as in FIG. 6. The validity output relay 440 is energized by transistor 442 which is forward-biased by current in resistor 444 unless transistor 446 is saturated. Transistor 446 is saturated by means of current $I_A$ developing a voltage across resistor 448 and causing base current to flow in resistor 450. Thus $I_A$ controls the state of validity output relay 440. $I_A$ is in turn controlled by an F.E.T.-bipolar transistor circuit which has high input impedance and high output current. When the gate of transistor 452 is near the positive supply voltage, it has negligible channel current because of source bias provided by resistors 454, 456, and 458. Thus there is negligible base and collector current in transistor 460 (negligible $I_A$). This situation permits the validity output relay 440 to be energized and therefore corresponds to a valid loop current I. Conversely, if the gate of transistor 452 is not held high, its voltage will decrease exponentially according to the time constant of resistor 462 and capacitor 464 until transistor 452 begins to conduct. This will provide some base current for transistor 460 which will begin to sink some $I_A$. $I_A$ must flow in the emitter of transistor 460, which increases the voltage across resistor 458 and thus raises the voltage of the source of FET 452. This is positive feedback for the circuit, and will cause $I_A$ to increase until transistor 460 is saturated, whereupon $I_A$ is limited by resistors 458, 466, and 448, and light-emitting diode 468. Under these circumstances the validity output relay 440 will be de-energized corresponding to an invalid loop current I. The current drawn by transistor 460 is made to flow in L.E.D. 468 to provide a visual indication of an invalid state. Zener diode 470 is placed in parallel with L.E.D. 468 so that transistor 460 may sink $I_A$ in the event of a failure of L.E.D. 468. In order to indicate a valid output over the range of current $I_s$ to $I_{s'}$ in which the main output relay is energized, the gate of transistor 452 is held high by the main output drive transistor 426 and diode 472. The lower valid range between $I_X$ and $I_Y$ is produced by op-amps 407 and 408 acting through diode 435 to hold the gate of transistor 452 high. If I is less than $I_Y$ the output of op-amp 408 will be high. This will hold the gate of transistor 452 high unless I is also less than $I_X$, in which case op-amp 407's output will be low and diode 434 will prevent op-amp 408 from holding the gate of transistor 452 high. Resistor 476 is placed in the output of op-amp 408 to limit the output currents of op-amps 407 and 408 under the latter circumstances.

The operation of the barrier reset circuitry will now be described. A triac-type intrinsic safety barrier may include means for triggering its triacs if the loop current through the barrier exceeds some value, so as to reduce the voltage to and divert current from the field wiring. A momentary short in the field wiring will thus trigger the barrier and at best will require the barrier to be disconnected from the loop power source to reset it, and at worst may blow a fuse on the power source side of the barrier if the source capability exceeds such a fuse's rating. The result is troublesome maintenance and downtime and possibly a destroyed barrier, unless provision has been made to limit the current which may flow in a tripped barrier and to automatically disconnect the barrier from the source and reset it. The circuit of FIG. 13 does this so that normal operation will automatically resume when an overcurrent fault is corrected, and so that no damage will occur, by using the $I_{s'}$ switching point generated by op-amp 410 to cut off a normally-conducting transistor circuit between the receiver's current-sensing resistor 402 and the input of a barrier (if present). So long as the current drawn from the receiver is less than $I_{s'}$, the output of op-amp 410 will be high and divider 478, 480 will hold transistor 482 off. Some of the current drawn from the receiver will flow in resistor 484 causing transistor 492 to conduct. This provides base drive for transistor 400, and with appropriate component values the bulk of the current flowing out of the receiver will be in transistor 400. Capacitor 494 will be charged to nearly the supply voltage by diode 490 and resistor 496. If I exceeds $I_{S'}$ op-amp 410's output will switch low and provide sufficient base drive through resistor 478 to saturate transistor 482. This causes some of the charge accumulated on capacitor 494 to dump through diode 488 onto capacitor 498 thereby raising the voltage on their connection. This cuts off transistor 492 thereby removing base drive for transistor 400. In this condition the only current leaving the receiver is in resistors 484 and 500 and, provided this current is less than the holding current of the intrinsic safety barier triacs, the triacs will turn off. Thus op-amp 410 renders the signal loop in a low current condition, causing the output of op-amp 410 to go high again. Transistor 482 is thereby cut off, and the voltage on capacitor 498 will decay by current drawn through resistors 484, 486, and the field wiring and eventually turn on transistors 492 and 400. As transistors 492 and 400 start to turn on, the voltage at the + signal wire will start to increase, reducing the current through resistor 484. Since this current must exceed the current through resistor 486 from capacitor 498 in order to supply base drive to transistor 492, the rate of rise of the voltage at the + signal wire is limited to the rate of decay of the voltage on capacitor 498 multiplied by the ratio of resistor 484 to resistor 486. This prevents the intrinsic safety barrier triacs from being turned back on by the rate of rise of applied voltage. Should the current rise above $I_{S'}$ again, the circuit will again cut off pass transistor 400, and will thus alternately cut off and reapply power to the signal wires until the overcurrent fault is corrected and normal operation resumes. Capacitor 502 applies temporary positive feedback to the positive input of op-amp 410 so that its output will slew rapidly between its saturated high and low levels, causing transistors 482 and 492 to switch fully and suddenly on and off, respectively.

If the barrier reset circuit is alternately cutting off and reapplying power to the signal wires, it is important that the main and validity output relays be de-energized to indicate the faulty condition and take the least damaging control action. With no provision for doing this, the outputs would be alternately energized and de-energized. The main output is held de-energerized by the action of diode 504, capacitor 507 and resistors 430 and 432. As I exceeds $I_{S'}$ and op-amp 410 switches low, capacitor 507 is charged through resistor 436 and diode 504. The stored voltage on capacitor 507 holds transistor 438 on (and therefore holds the relay drive transistor 426 off) for a time determined by capacitor 507 and resistors 430 and 432. If this time is longer than the reset period, the main output relay 428 will be de-energized during reset action. The validity output will then be de-energized if the anode of diode 435 is held low. This is accomplished by diode 434 and capacitor 506. When transistor 400 becomes cut off and I becomes less than $I_X$, op amp 407 will switch low and discharge capacitor 506, thus preventing the gate of transistor 452 from being held high by diode 435. So long as the charging of capacitor 506 through resistor 476 during the time I is between $I_X$ and $I_Y$ is insufficient to raise the voltage thereon above that required to deplete transistor 452, the validity output will be de-energized during reset action.

The reset circuitry will prevent excessive loop current and possible damage to the receiver whether or not intrinsic safety barriers are in the loop.

Other features of the receiver: the validity output is designed to be controlled by $I_A$ so that the validity output may service a number of signal loops each having dedicated detection and main output circuits such as that to the left of the dotted line in FIG. 13. With such a system, the validity output would be energized only if all signal loops had valid currents, and would indicate a fault if a fault existed in any loop. With such a system, L.E.D. 468 would indicate which loop contains a fault. Diodes 510 and 512 are freewheeling diodes preventing inductive spiking when the relays are turned off. L.E.D.'s 474 and 516 provide visual indication of the state of the main relay as follows: if transistor 426 is saturated, current flows in resistor 518 and L.E.D. 474 causing L.E.D. 474 to light; if transistor 426 is cut off, resistor 518 provides base current for transistor 520 whose collector current lights L.E.D. 516 to indicate that the main relay 428 is de-energized. An identical circuit is shown connected to the validity relay 440. Diode 522 provides a temperature-compensated voltage referenced to the positive supply to which the reference divider chain 412–417 and the signal divider 404, 406 are connected. Capacitor 524 provides decoupling for the op-amps 407–410 and other circuitry. Zener diode 526 protects the circuitry against supply voltage transients. Diodes 528 and 530 clamp the voltage at the signal wire terminal to protect the reset circuit from transient damage. Potentiometer 417 provides an adjustment for the four switching points of the detector to account for component tolerances. Resistors 532, 534, and 536 provide a small amount of hysteresis to eliminate chatter at the switching points $I_Y$, $I_S$, $I_{S'}$, while resistors 538, 547, and 542 do the same for the $I_X$ switching point. The receiver is shown powered from a supply with a regulated output V+ to C and an unregulated output V+ to B−; it will be understood that the relays and associated L.E.D. circuits could alternatively be powered from the regulated supply. Terminal "L" provides a D.C. voltage output which is substantially at either V+ (when the main output relay is energized), or B− (when the main output relay is de-energized). Such an output can be similarly provided for the validity output. It is useful, for example, for generating logic-level outputs for connection to equipment such as computers.

It should be noted that although the receiver shown has four switching points, other receivers having more or fewer switching points can be made in accordance with this invention.

Although a preferred embodiment of the invention has been shown and described, it will be understood that various modifications may be made without departing from the true spirit and scope of the invention as set forth in the appended claims.

We claim:

1. An admittance-responsive two-wire instrument system comprising a power supply and a receiver in one location, an active transmitter and an admittance-sensitive probe in another location, said probe being operatively connected to said transmitter, and a pair of signal wires connecting the transmitter with the receiver to form a loop, wherein the transmitter comprises means responsive to the admittance sensed by said probe for controlling the current in the loop independent of the resistance of the loop, said means for controlling being adapted to control the current to take values falling within at least one first predetermined current range within a second larger predetermined current range, said second current range not including the short and open circuit currents in said loop, and wherein the receiver comprises means for distinguishing between currents in the loop falling within the at least one first range, currents within the second larger current range but outside of the at least one first range, and the short and open circuit currents in said loop.

2. A system as claimed in claim 1 in which the receiver comprises means for establishing at least one window with which the current signals in the loop are compared.

3. A system as claimed in claim 2 in which said at least one window effectively comprises maximum and minimum signal levels corresponding to the limits of the at least one first current range.

4. A system as claimed in claim 3 in which the window comprising the lowest minimum signal level does not include a zero current signal level.

5. A system as claimed in claim 4 in which the window having the lowest minimum signal level has its minimum and maximum signal levels closely spaced relative to the distance between its minimum signal level and zero.

6. A system as claimed in claim 3 in which the window having the highest maximum signal level does not include the maximum signal level occurring at the receiver due to a fault in said transmitter means.

7. A system as claimed in claim 2 in which said receiver comprises means for establishing plural windows for comparison to the current signals in the loop.

8. A system as claimed in claim 7 in which said windows are non-overlapping.

9. A system as claimed in claim 7 in which said windows are noncontinguous.

10. A system as claimed in claim 1 in which the receiver comprises means for generating an alarm signal when the current in the loop does not fall within either the first or second predetermined signal ranges.

11. A system as claimed in claim 10 comprising means for replacing the transmitter by a second transmitter in response to said alarm signal.

12. A system as claimed in claim 11 comprising means for actuating a further alarm if the alarm signal is given after replacement of the first transmitter by the second transmitter.

* * * * *

UNITED STATES PATENT AND TRADEMARK OFFICE

CERTIFICATE OF CORRECTION

PATENT NO. : 4,573,040

DATED : Feb. 25, 1986

INVENTOR(S) : Frederick L. Maltby and Jonathan Kramer

It is certified that error appears in the above-identified patent and that said Letters Patent is hereby corrected as shown below:

On the cover sheet, Item [63], after first sentence, insert -- Application Serial No. 419,127 is a continuation of application Serial No. 98,750 filed November 30, 1979, now U.S. Patent No. 4,363,030. --

Column 1, line 5, after "abandoned.", insert -- Application Serial No. 419,127 is a continuation of application Serial No. 98,750 filed November 30, 1979, now U.S. Patent No. 4,363,030. --

Column 5, line 3, delete "FLM, LJK".

Column 6, line 68, delete "measure" and insert therefor -- measured --.

Column 18, line 63, delete "divider" and insert therefor -- dividers --.

Signed and Sealed this

*Second* Day of *September 1986*

[SEAL]

*Attest:*

DONALD J. QUIGG

*Attesting Officer*

*Commissioner of Patents and Trademarks*